United States Patent
Polo et al.

(10) Patent No.: US 10,506,318 B2
(45) Date of Patent: Dec. 10, 2019

(54) SYSTEM AND METHOD FOR SIGNAL READ-OUT USING SOURCE FOLLOWER FEEDBACK

(71) Applicant: Infineon Technologies AG, Neubiberg (DE)

(72) Inventors: Francesco Polo, Arnoldstein (AT); Richard Gaggl, Poertschach am Woerthersee (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/045,372

(22) Filed: Jul. 25, 2018

(65) Prior Publication Data

US 2018/0332377 A1     Nov. 15, 2018

Related U.S. Application Data

(63) Continuation-in-part of application No. 15/864,673, filed on Jan. 8, 2018, now Pat. No. 10,313,773, which is a continuation of application No. 15/050,972, filed on Feb. 23, 2016, now Pat. No. 9,866,939.

(51) Int. Cl.
*G06G 7/12* (2006.01)
*H04R 1/04* (2006.01)
*H03F 3/50* (2006.01)
*H03F 1/14* (2006.01)
*H03F 3/45* (2006.01)
*H04R 3/00* (2006.01)
*H04R 19/04* (2006.01)

(52) U.S. Cl.
CPC ............... *H04R 1/04* (2013.01); *H03F 1/14* (2013.01); *H03F 3/45179* (2013.01); *H03F 3/45376* (2013.01); *H03F 3/45475* (2013.01); *H03F 3/505* (2013.01); *H04R 3/00* (2013.01); *H04R 19/04* (2013.01); *H03F 2200/03* (2013.01); *H03F 2200/151* (2013.01); *H03F 2200/153* (2013.01); *H03F 2203/45116* (2013.01); *H03F 2203/45384* (2013.01); *H03F 2203/45512* (2013.01); *H03F 2203/45544* (2013.01); *H03F 2203/45594* (2013.01); *H03F 2203/5033* (2013.01); *H04R 2201/003* (2013.01)

(58) Field of Classification Search
CPC ....... H04R 3/00; H01L 2924/00; G06F 3/044; H03F 3/005; H03F 3/45475; G06K 19/0723

See application file for complete search history.

(56) References Cited

U.S. PATENT DOCUMENTS

| | | |
|---|---|---|
| 7,151,410 B2 | 12/2006 | Franck et al. |
| 9,391,628 B1 | 7/2016 | Lyden et al. |
| 2007/0216455 A1* | 9/2007 | Abbasi ............... H03K 5/133 327/158 |

(Continued)

OTHER PUBLICATIONS

Dehe, A., et al, "The Infineon Silicon MEMS Microphone", AMA Conferences 2013—Sensor 2013, pp. 95-99, 2013.

(Continued)

*Primary Examiner* — Sibin Chen
(74) *Attorney, Agent, or Firm* — Slater Matsil, LLP

(57) ABSTRACT

In accordance with an embodiment, a circuit includes an amplifier and a programmable capacitor coupled between an output of the first non-inverting and the input of the first amplifier.

24 Claims, 22 Drawing Sheets

(56) References Cited

U.S. PATENT DOCUMENTS

| | | | |
|---|---|---|---|
| 2010/0102878 A1* | 4/2010 | Nagata | G01C 19/56 |
| | | | 330/86 |
| 2010/0182086 A1 | 7/2010 | Cozzolino | |
| 2010/0254549 A1* | 10/2010 | Onishi | H01L 27/0811 |
| | | | 381/120 |
| 2011/0116287 A1* | 5/2011 | Huang | H02M 1/44 |
| | | | 363/21.13 |
| 2011/0255228 A1* | 10/2011 | Kimura | G01D 5/24 |
| | | | 361/679.01 |
| 2013/0064397 A1 | 3/2013 | Dünser | |
| 2013/0222662 A1* | 8/2013 | Sakurai | H04N 5/378 |
| | | | 348/308 |
| 2014/0292410 A1 | 10/2014 | Danjo | |
| 2015/0125003 A1 | 5/2015 | Wiesbauer et al. | |
| 2015/0181352 A1 | 6/2015 | Astgimath et al. | |
| 2015/0318829 A1* | 11/2015 | Astgimath | H03F 3/505 |
| | | | 381/120 |
| 2017/0047896 A1 | 2/2017 | Shu et al. | |
| 2017/0150253 A1 | 5/2017 | Ravnkilde et al. | |

OTHER PUBLICATIONS

Figure supplied by Inventor, May 2015, 1 pg.

Infineon Technologies AG, "SMM310 Silicon MEMS Microphone" Small Signal Discretes, Data Sheet, V.1.1, pp. 1-13, May 2008.

Shedge, D.K., et al., "A CMOS Source Follower and Super Source Followers", ACEEE International Conference on Advances in Electrical & Electronics 2012, pp. 63-66.

Shedge, D.K., et al., "Analysis and Design of CMOS Source Follower and Super Source Follower", ACEEE International Journal on Control System and Instrumentation, vol. 4, No. 2, pp. 54-58, Jun. 2013.

* cited by examiner

SYSTEM AND METHOD FOR SIGNAL READ-OUT USING SOURCE FOLLOWER FEEDBACK

This application is a continuation-in-part of U.S. patent application Ser. No. 15/864,673, filed on Jan. 8, 2018, which is a continuation of U.S. patent application Ser. No. 15/050,972, filed on Feb. 23, 2016, now U.S. Pat. No. 9,866,939, which applications are hereby incorporated herein by reference in their entirety.

TECHNICAL FIELD

The present invention relates generally to a system and method for signal read-out, and, in particular embodiments, to a system and method for signal read-out using source follower feedback.

BACKGROUND

Small-scale sensors are used in a wide variety of applications, a few examples of which include microphone systems, blood pressure monitoring systems, and accelerometer systems for, e.g., airbag deployment. To allow the use of sensors to become even more widespread, the size of end products that read out signals from these sensors is continually decreasing.

Additionally, to support the reduced size of these end products, sensors may be implemented using Micro-Electro-Mechanical Systems (MEMS). For example, mobile phone products, which are becoming more and more compact, especially in thickness, may use MEMS microphone implementations.

Moreover, to further reduce end product size the MEMS sensors themselves continue to shrink. As the package size of MEMS sensors decreases, however, the sensitivity of these sensors may also decrease.

SUMMARY

In accordance with an embodiment, a circuit includes an amplifier and a programmable capacitor coupled between an output of the first non-inverting and the input of the first amplifier.

In accordance with another example embodiment, a system includes a first AC coupling capacitor comprising a first signal terminal, a second signal terminal, and a first parasitic terminal, wherein the first AC coupling capacitor has a first capacitance between the first signal terminal and the second signal terminal and a second capacitance between the second signal terminal and the first parasitic terminal; a first amplifier having an input coupled to the first signal terminal of the first AC coupling capacitor; and a first programmable capacitor coupled between an output of the first amplifier and the second signal terminal of the first AC coupling capacitor.

In accordance with a further example embodiment, a differential amplifier circuit includes a first buffer circuit having a first source follower transistor having a gate coupled to a first input of the differential amplifier circuit and a source coupled to a first output of the differential amplifier circuit, and a first current source transistor having a drain coupled to a source of the first source follower transistor; a second buffer circuit having a second source follower transistor having a gate coupled to a second input of the differential amplifier circuit and a source coupled to a second output of the differential amplifier circuit, and a second current source transistor having a drain coupled to a source of the second source follower transistor; a first capacitor network coupled between the first output of the differential amplifier circuit and a gate of the second current source transistor; a first feedback capacitor coupled between the first output of the differential amplifier circuit and the first input of the differential amplifier circuit; a second capacitor network coupled between the second output of the differential amplifier circuit and a gate of the first current source transistor; and a second feedback capacitor coupled between the second output of the differential amplifier circuit and the second input of the differential amplifier circuit.

In accordance with another example embodiment, a method of amplifying an output of Micro-Electro-Mechanical Systems (MEMS) microphone includes AC coupling a first output of the MEMS microphone using a first AC coupling capacitor to produce a first AC coupled signal at a first feedback node; amplifying the first AC coupled signal using a first amplifier to produce a first amplified signal; and feeding back the first amplified signal to the first feedback node via a first programmable capacitor.

In accordance with a further example embodiment, an integrated circuit includes a first non-inverting amplifier disposed on a monolithic semiconductor substrate, the first non-inverting amplifier having an input coupled to a first input pad of the semiconductor circuit; and a first programmable capacitor disposed on the monolithic semiconductor substrate, the first programmable capacitor directly connected between an output of the first non-inverting and the input of the first non-inverting amplifier.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
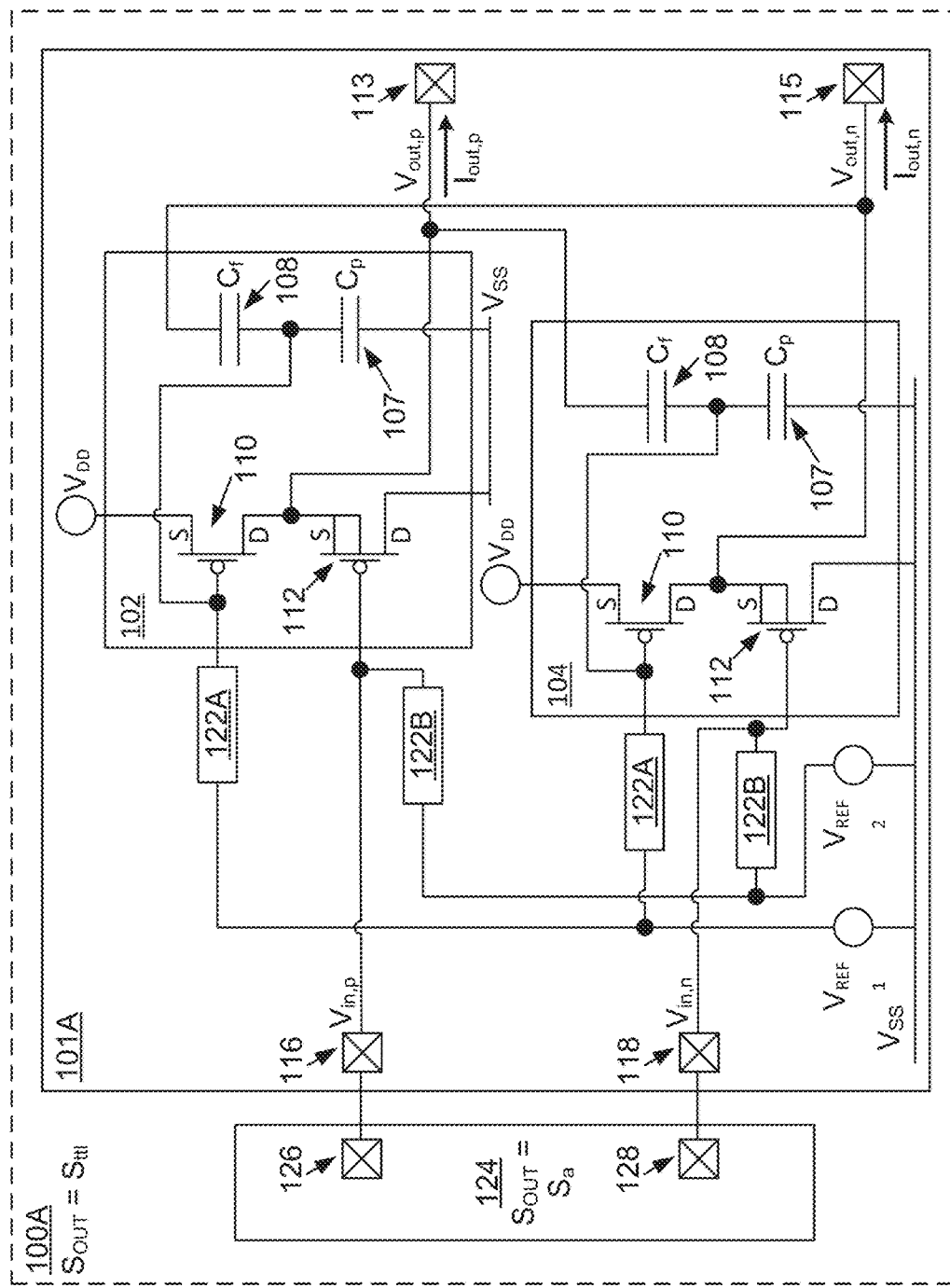
FIG. 1A is a block diagram that illustrates an amplification system having an amplifier circuit that uses capacitive feedback, in accordance with one of a number of embodiments.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The present invention will be described with respect to embodiments in a specific context, a system and method for sensor read-out for a capacitive microphone sensor. Further embodiments may be used to read out a variety of signal types using configurable amplification or attenuation by a stage having high input impedance.

In various embodiments, an amplifier circuit having a differential or pseudo-differential output and, for example, a source follower topology or a Super Source Follower (SSF) topology, is enhanced with a capacitive feedback in order to have a configurable gain. Relative to a source follower circuit without capacitive feedback, the gain of this differential amplifier may be either a positive-decibel (dB) gain of greater than zero dB, or a negative-dB gain of less than zero dB (i.e., an attenuation). In various embodiments, the amplifier circuit is used to amplify a signal from, for example, a double-back plate MEMS device (e.g., a microphone) where the outputs of the MEMS device are biased in a constant-charge configuration by being connected to high impedance nodes. In various embodiments, high impedance nodes of the amplifier circuit are provided by buffer amplifiers that have a high input impedance and a low output impedance.

In various embodiments, the differential amplifier includes a first subcircuit and a second subcircuit that each includes a source follower transistor respectively providing the positive and negative output signals of the amplifier's differential output. Scaled versions of each of these positive and negative output signals are fed back to gates of respective current biasing transistors included in each subcircuit. These scaled output signals thereby control the amount of current that flows through the transistors of the subcircuit. In some embodiments, the feedback is configured such that the current signal in the current biasing transistor has equal phase with respect to the input voltage signal of the same subcircuit, thus providing output voltage amplification. In other embodiments, the feedback is configured such that the current signal in the current biasing transistor has opposite phase with respect to the input voltage signal of the same subcircuit, thus providing output voltage attenuation.

In various embodiments, the configurable gain or attenuation varies in accordance with the amplitude of the variation of the current through the current biasing transistor and its phase compared to the input voltage signal. In some embodiments, the configurable gain is applied to the differential signal provided by an input device having an output sensitivity $S_a$, such that a target total output sensitivity $S_{ttl}$ of the overall system may be achieved. The input device may be, for example, a MEMS microphone that is biased in a constant-charge configuration or constant-voltage configuration and that provides a differential output.

FIG. 1A illustrates an amplification system 100A that includes an amplifier circuit 101A, which uses capacitive feedback to provide a configurable voltage gain. Amplifier circuit 101A includes input stages 102 and 104 that have high input impedances and that read out the output signal from an input device 124 that is included in the amplification system 100A. Input stages 102 and 104 may also be referred to as buffer amplifiers. Amplifier circuit 101A also includes respective output terminals 113 and 115 for each of these input stages 102 and 104. Output terminal 113 provides a first output signal having a voltage $V_{out,p}$ and a current $I_{out,p}$, and output terminal 115 provides a second output signal having a voltage $V_{out,n}$ that is the negative of $V_{out,p}$ and a current $I_{out,n}$ that is the negative of $I_{out,p}$.

A respective feedback capacitor 108 is included in each of input stages 102 and 104 and has a capacitance $C_f$. In amplification system 100A, the output terminal 113 is cross-connected to the feedback capacitor 108 of input stage 104, and the output terminal 115 is similarly cross-connected to the feedback capacitor 108 of input stage 102. These cross-connected feedback paths allow the amplifier circuit 101A to provide a relatively increased gain, i.e., a positive-dB gain, as compared to amplifier circuit 101C of FIG. 1C, which lacks feedback.

In other embodiments, output terminal 113 is connected to input stage 102 and output terminal 115 is connected to input stage 104, such that the feedback paths allow the amplifier circuit 101A to provide a relatively decreased gain, or in other words, a negative-dB gain or relatively increased attenuation relative to that of the amplifier circuit 101C.

Referring again to FIG. 1A, input device 124 has an output sensitivity $S_{OUT}=S_a$. By configuring the amplifier circuit 101A for positive gain, the amplification system 100A may achieve a target output sensitivity $S_{ttl}$ even when $S_a$ is less than $S_{ttl}$.

The amplifier circuit 101A also includes input terminals 116 and 118 that are connected to differential output terminals 126 and 128 of the input device 124. In an embodiment, the amplifier circuit 101A is implemented on an integrated circuit (IC) that may be, for example, an Application Specific IC (ASIC). In such an IC embodiment, input terminals 116 and 118 and output terminals 113 and 115 may be, e.g., contact pads of the IC. In some embodiments, input device 124 is a double-back plate MEMS microphone device such as, for example, a microphone, where the outputs of the MEMS device are biased in a constant-charge configuration by being connected to high impedance nodes. In other embodiments, input device 124 is any circuit having a differential output to be amplified by an amplifier having a high input impedance and a configurable gain.

Referring again to FIG. 1A, each of the input stages 102 and 104 includes a respective current biasing transistor 110 that acts as a controlled current source for a respective source follower transistor 112. In an embodiment, current biasing transistors 110 and source follower transistors 112 may be implemented as Metal Oxide Semiconductor Field Effect Transistors (MOSFETs), and in particular, as p-channel Metal Oxide Semiconductor (PMOS) transistors. To provide gate voltage bias and to allow signal swing at the gates of each of current biasing transistors 110, these gates are each connected via a respective high-ohmic resistance stage 122A to a voltage $V_{REF1}$. Voltage $V_{REF1}$ is filtered by low-pass capacitors 107, which each has a respective capacitance $C_p$. In each of the input stages 102 and 104, one of these low-pass capacitors 107 is respectively connected between the gate of current biasing transistor 110 and a low-side rail voltage $V_{SS}$. Each of current biasing transistors 110 also has its respective source connected to a high-side rail voltage $V_{DD}$. In alternative embodiments, low-pass capacitors 107 are connected between the gate of current biasing transistor 110 and high-side rail voltage $V_{DD}$ in order to achieve a better power supply rejection ratio (PSRR). When the sources of biasing transistors 110 and low-pass capacitors 107 all referenced to high-side rail voltage $V_{DD}$, the change in the gate-source voltage of current biasing transistors 110 caused by a transient voltage on high-side rail voltage $V_{DD}$ is reduced.

Input terminal 116 is connected to the gate of the source follower transistor 112 of input stage 102, and provides it a first differential input signal having a voltage $V_{in,p}$. Input terminal 118 is similarly connected to the gate of the source follower transistor 112 of input stage 104 and provides it a second differential input signal having a voltage $V_{in,n}$ that is the negative of $V_{in,p}$.

Input terminals 116 and 118 are also each connected to a respective high-ohmic resistance stage 122B that is connected to a source follower bias voltage $V_{REF2}$. In some embodiments, each of resistance stages 122A and 122B may have a resistance on the order of, e.g., hundreds of giga-ohms, and may include switchable diodes and/or transistors to allow current to be conducted only when the difference in voltage between the resistance stage's two terminals exceeds a pre-determined threshold.

Referring again to FIG. 1A, each of the source follower transistors 112 has, respectively, its drain connected to voltage $V_{SS}$ and its body interconnected with its source. Also, in each of input stages 102 and 104, respectively, a common output node connects the source of source follower transistor 112 to the drain of current biasing transistor 110. These common output nodes, of input stages 102 and 104 respectively, provide a differential pair of output signals at output terminals 113 and 115 of the amplifier circuit 101A. A capacitive feedback coefficient $K_c$ may be calculated from the capacitance $C_f$ of each of the feedback capacitors 108 and capacitance $C_p$ of each of the low-pass capacitors 107, in accordance with Equation 1 below:

$$K_c = C_f/(C_f + C_p) \quad \text{(Eq. 1).}$$

When output terminals 113 and 115 have an open-circuit condition, the voltage gain $V_{out,p}/V_{in,p}$ and the voltage gain $V_{out,n}/V_{in,n}$ are both equal to the same positive-dB voltage gain $A_v$. This open-circuit gain varies in accordance with the amplitude of the variation of current flowing through the current biasing transistors 110, which is the same variation for both input stages 102 and 104. Since each of the capacitive networks formed by feedback capacitors 108 and low-pass capacitors 107 controls the current through the current biasing transistors 110, respectively, the open-circuit gain thus also varies in accordance with the capacitive feedback coefficient $K_c$ of Equation 1 above. Equation 2 below shows an approximation for this open-circuit voltage gain $A_v$ of differential circuit 101A, where $gm_{sf}$ is the transconductance of each of the source follower transistors 112, and $gm_s$ is the transconductance of each of the current biasing transistors 110:

$$A_v = \frac{gm_{sf}}{gm_{sf} - gm_s K_c}. \quad \text{(Eq. 2)}$$

Figure 1B:
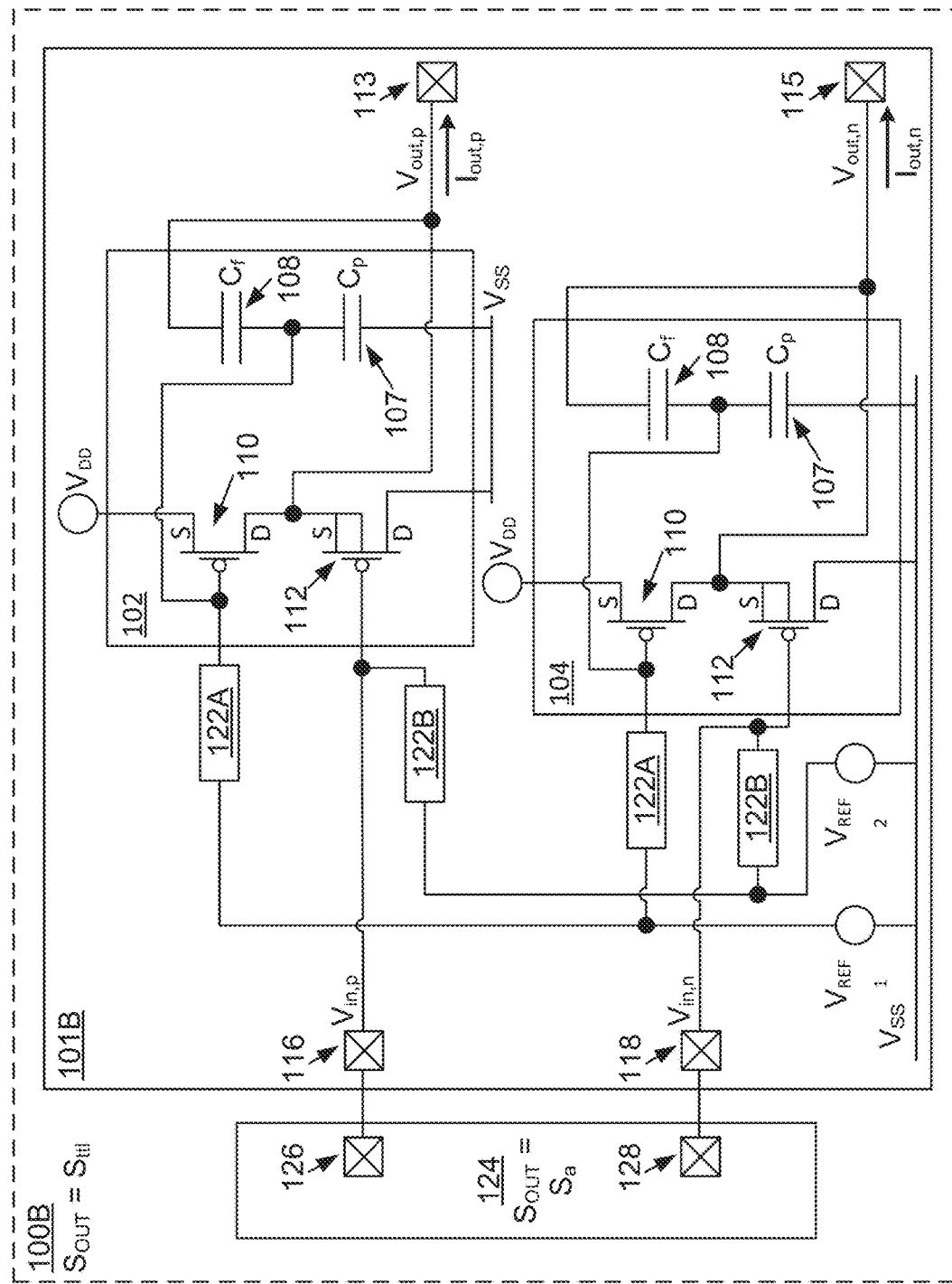
FIG. 1B is a block diagram that illustrates an alternative amplification system having an amplifier circuit that uses capacitive feedback, in accordance with one of a number of embodiments.
Figure 1C:
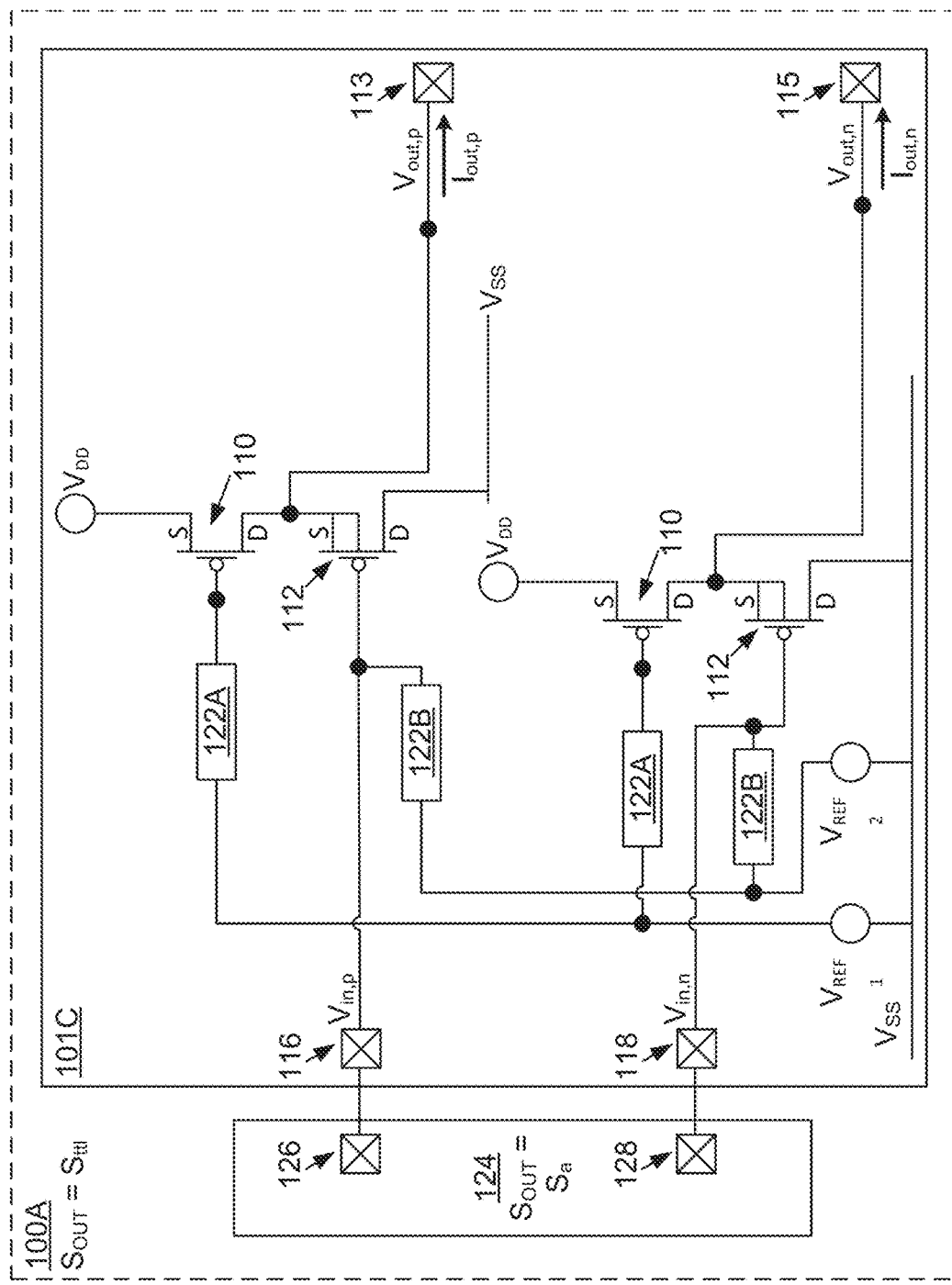
FIG. 1C is a block diagram that illustrates an amplification system that lacks capacitive feedback, in accordance with one of a number of embodiments.

FIG. 1B illustrates an amplification system 100B which uses capacitive feedback to provide a configurable negative-dB voltage gain for amplifier circuit 101B. Such negative-dB gain may be used, for example, when $S_a$ is greater than $S_{ttl}$ to obtain the desired system sensitivity.

The only difference from the amplifier circuit 101A of FIG. 1A is that output terminal 113 of amplifier circuit 101B of FIG. 1B is connected to input stage 102 instead of being cross-connected to input stage 104, and output terminal 115 is connected to input stage 104 instead of being cross-connected to input stage 102. The capacitive feedback coefficient $K_c$ thus has a reversed sign, as shown in Equation 3 below:

$$K_c = -C_f/(C_f + C_p) \quad \text{(Eq. 3).}$$

Amplifier circuit 101B therefore provides a negative-dB open-circuit voltage gain $A_v$ that is also approximated by Equation 2 above.

Figure 2:
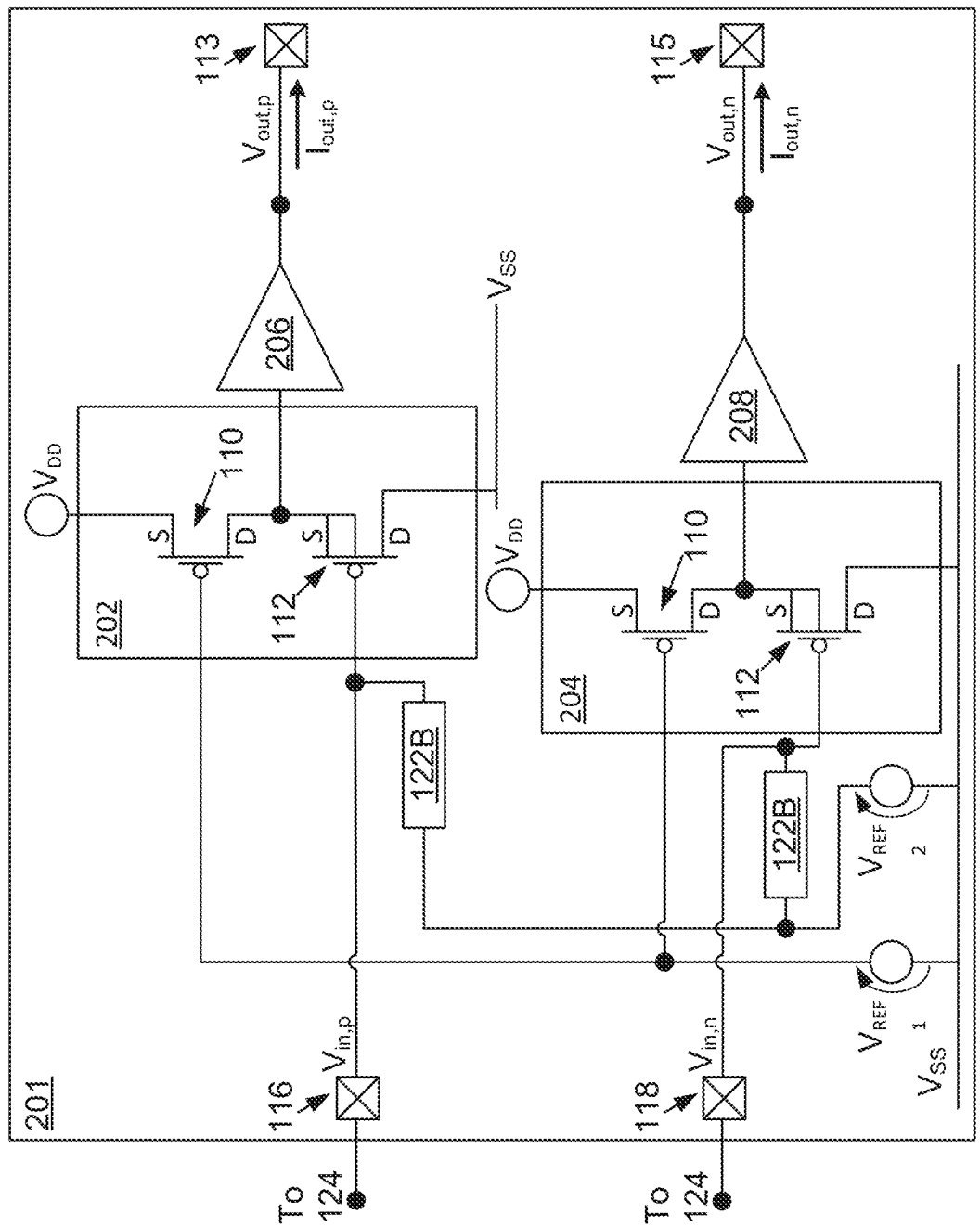
FIG. 2 is a block diagram that illustrates an amplifier circuit that used dedicated gain stages that do not have capacitive feedback, in accordance with one of a number of embodiments.

FIG. 2 illustrates an amplifier circuit 201 that does not use capacitive feedback but instead includes a dedicated pair of positive-dB gain stages 206 and 208. As compared to the amplifier circuit 101A of FIG. 1A, positive-dB gain stages 206 and 208 have been added to the amplifier circuit 201. Also, each of input stages 102 and 104 of FIG. 1A have been replaced in FIG. 2 with input stages 202 and 204 that do not receive capacitive feedback and have fixed gain between their output and input that is not greater than 0 dB. Each of input stages 202 and 204 is respectively the same as high input impedance of input stages 102 and 104 of FIG. 1A, except that each respective current biasing transistor 110 has its gate connected directly to $V_{REF1}$ but not to a capacitive feedback path, the low-pass capacitors 107 have been removed, and the capacitive feedback paths provided by feedback capacitor 108 have also been removed.

Referring again to FIG. 2, positive-dB gain stages 206 and 208 respectively receive outputs of input stages 202 and 204 and provide the voltages $V_{out,p}$ and $V_{out,n}$. Each of the input stages 202 and 204 and the positive-dB gain stages 206 and 208 contribute noise to the two output signals and consume current and space in the amplifier circuit 201, which reduces the performance of amplifier circuit 201 relative to amplifier circuit 101A of FIG. 1A. Additionally, when operating with an input device having an output sensitivity $S_a$ that is greater than the target total system sensitivity $S_{ttl}$ (shown in FIG. 1A), the amplifier circuit 201 does not support a configurable negative-dB gain.

Figure 3:
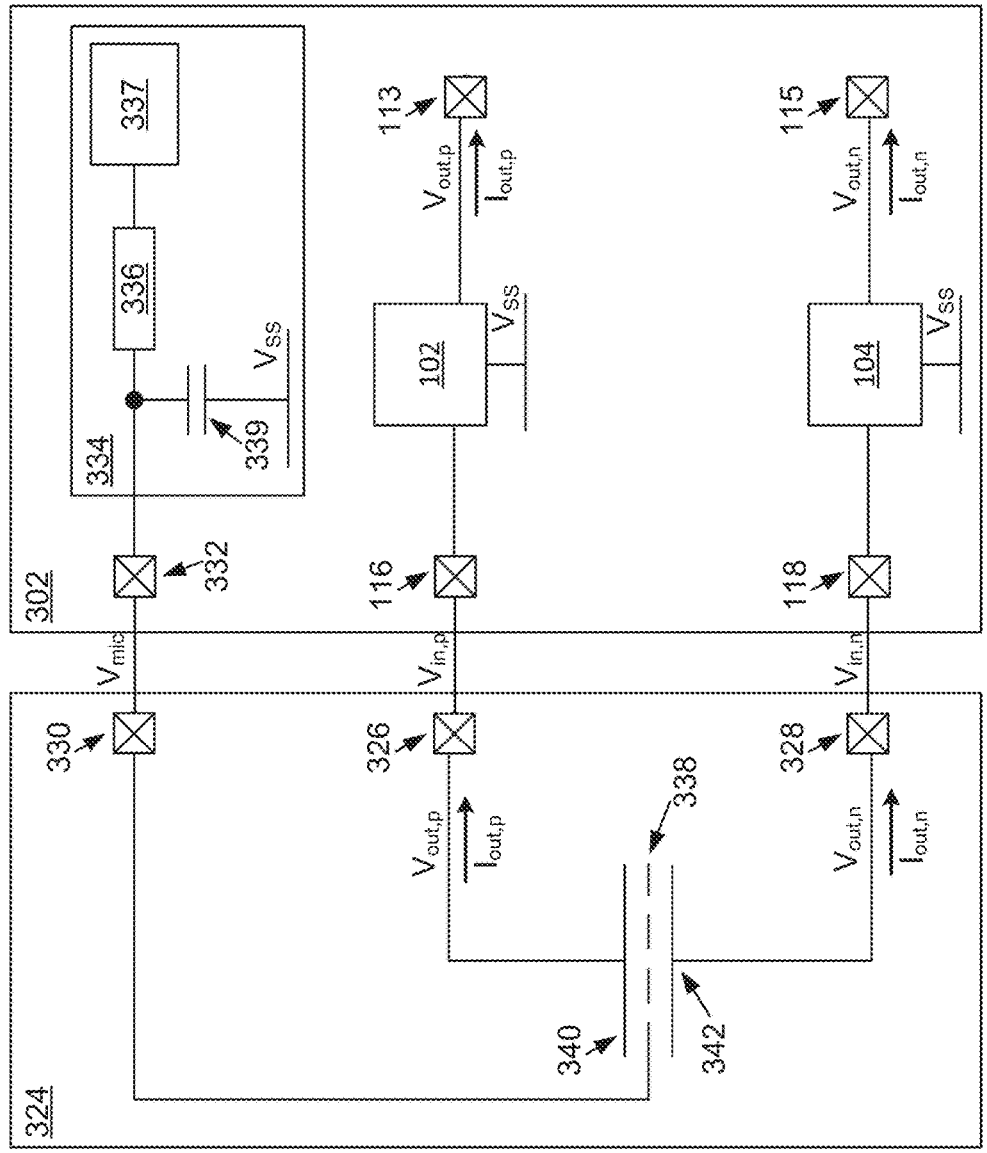
FIG. 3 is a block diagram that illustrates a MEMS microphone that may be used as an input device of the amplification systems of FIGS. 1A and 1B, in accordance with one of a number of embodiments.

FIG. 3 illustrates a MEMS microphone 324 that may be used as the input device 124 of FIG. 1A and FIG. 1B. MEMS microphone 324 is connected to an IC 302 that includes input stages 102 and 104, input terminals 116 and 118, output terminal 332, and MEMS biasing circuit 334. Output terminals 326 and 328 of MEMS microphone 324 provide the differential MEMS readout signal to input stages 102 and 104. In an embodiment, the high input impedances of input stages 102 and 104 allow the output terminals 326 and 328 of the MEMS microphone 324 to be biased in a constant-charge configuration so that a fixed charged is stored on the MEMS microphone 324.

Referring again to FIG. 3, MEMS microphone 324, which is a double back-plate MEMS device, includes a membrane 338 that is capacitively coupled to a first back-plate 340 connected to the output terminal 326 of the MEMS microphone 324. Membrane 338 is also capacitively coupled to a second back-plate 342 that is connected to output terminal 328 of the MEMS microphone 324.

MEMS microphone 324 also includes an input terminal 330 that is connected to a MEMS bias voltage $V_{mic}$. Voltage $V_{mic}$ is provided by output terminal 332 of IC 302, which is connected to a high-ohmic resistance stage 336 of MEMS biasing circuit 334. High-ohmic resistance stage 336 is connected to a charge pump 337 that is also included in MEMS biasing circuit 334. The voltage $V_{mic}$ is low-pass filtered by a capacitor 339 that is also included in MEMS charging circuit 334. Capacitor 339 is connected to the output terminal 332 and to voltage $V_{SS}$.

Figure 4:
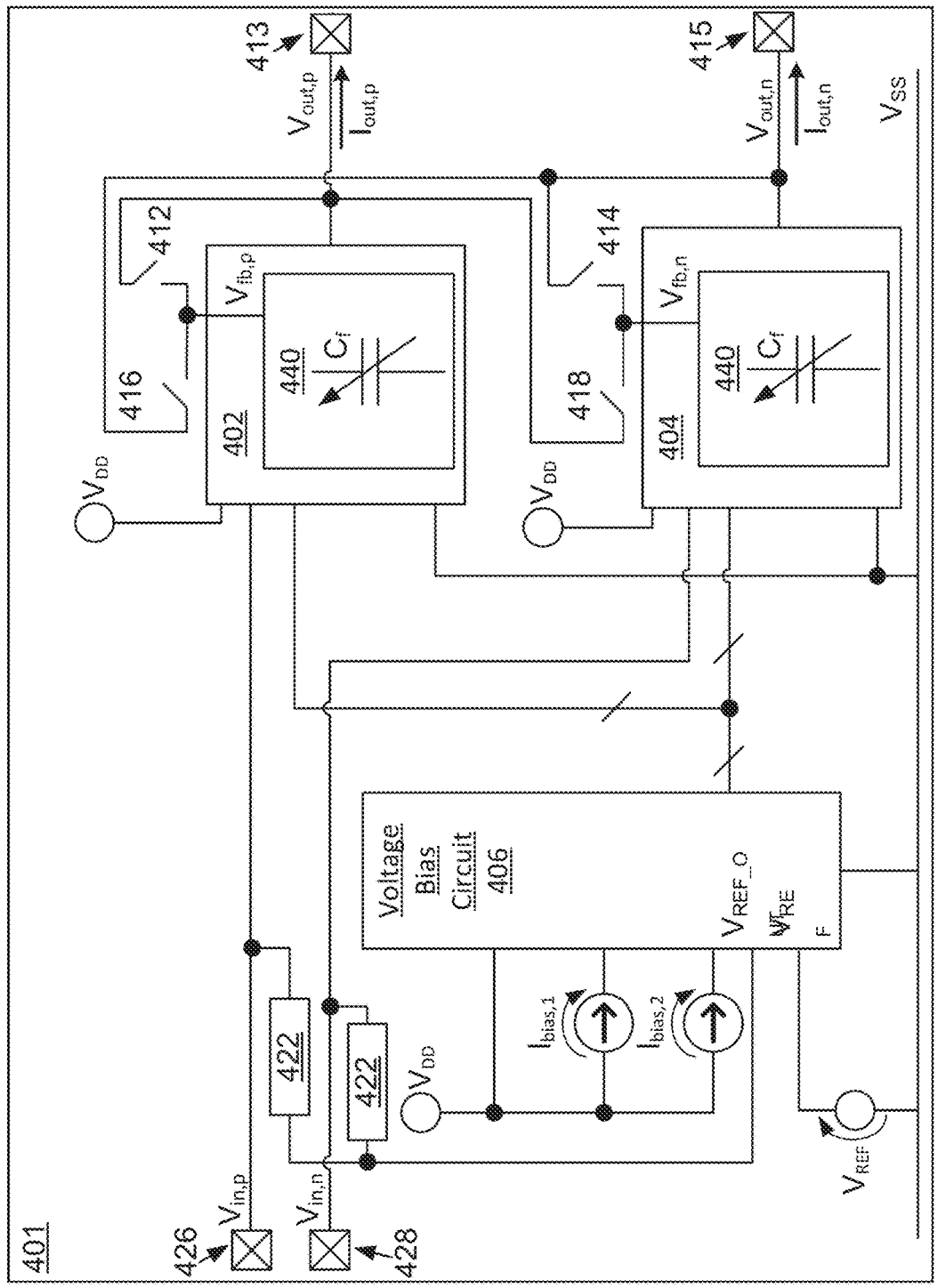
FIG. 4 is a block diagram that illustrates an amplifier circuit that includes adjustable feedback loops, in accordance with one of a number of embodiments.

FIG. 4 illustrates an embodiment amplifier circuit 401 that includes a voltage bias circuit 406 and adjustable feedback loops providing feedback from output terminals 413 and 415. These adjustable feedback loops provide feedback to each of input stages 402 and 404 that are included in the amplifier circuit 401.

Voltage $V_{out,p}$, which is determined by input stage 402 in accordance with voltage $V_{in,p}$ received at input terminal 426, is provided to output terminal 413 and is also fed back to a switch 412 connected to input stage 402 and to a switch 418 connected to input stage 404. Similarly, voltage $V_{out,n}$, which is determined by input stage 404 based on voltage $V_{in,n}$ received at input terminal 428, is provided to output terminal 415 and is also fed back to a switch 416 connected to input stage 402 and to a switch 414 connected to input stage 404.

Voltages $V_{in,p}$ and $V_{in,n}$ are provided to the amplifier circuit 401 by an input device having a differential output. This input device may be, for example, the MEMS microphone 324 of FIG. 3. The outputs of switches 412 and 416 are connected to a common node connected to input stage 402 that has a voltage $V_{fb,p}$, and the outputs of switches 414 and 418 are connected to a common node connected to input stage 404 that has a voltage $V_{fb,n}$. Switches 412 and 416 of the amplifier circuit 401 must be alternatively closed to avoid a short circuit between output terminals 413 and 415, and switches 414 and 418 of the amplifier circuit 401 must also be alternatively closed to avoid a short circuit between output terminals 413 and 415. Thus, the open/closed state of switch 412 is the same as that of switch 414, and the open/closed state of switch 416 is the same as that of switch 418 and the opposite of that of switch 412 and 414.

In some embodiments, the input stages 402 and 404 are configured such that when switches 412 and 414 are closed and switches 416 and 418 are open, the gain of the amplifier circuit 401 is a positive dB gain, and when switches 416 and 418 are closed and switches 412 and 414 are open, the gain of the amplifier circuit 401 is a negative dB gain. In other embodiments, the situation is reversed such that when switches 412 and 414 are closed and switches 416 and 418 are open, the gain of the amplifier circuit 401 is a negative dB gain, and when switches 416 and 418 are closed and switches 412 and 414 are open, the gain of the amplifier circuit 401 is a positive dB gain.

Referring again to FIG. 4, voltage $V_{fb,p}$ is provided from the common output node of switches 412 and 416 to a feedback capacitance bank 440 included in input stage 402, and voltage $V_{fb,n}$ is provided from the common output node of switches 414 and 418 to another feedback capacitance bank 440 included in input stage 404. The respective capacitance $C_f$ of the feedback capacitance banks 440 is configurable, resulting in a configurable gain supporting both positive-dB and negative-dB gain for amplifier circuit 401. For a positive-dB gain configuration, adjusting the capacitance $C_f$ would adjust the gain according to Equations 1 and 2 above, and for a negative-dB gain configuration, adjusting the capacitance $C_f$ would adjust the attenuation according to Equations 2 and 3 above.

Voltage bias circuit 406 provides a set of multiple reference voltages that are used to bias both the input stages 402 and 404. Voltage bias circuit 406 determines this set of reference voltages based on inputs that include adjustable bias currents $I_{bias,1}$ and $I_{bias,2}$, a voltage $V_{REF}$ (which is implemented as an adjustable voltage in amplifier circuit 401), and high and low DC rail voltages $V_{DD}$ and $V_{SS}$. These high and low DC rail voltages $V_{DD}$ and $V_{SS}$ are also provided to input stages 402 and 404. Input terminals 426 and 428 are also each connected to a respective high-ohmic resistance stage 422 that is connected to voltage $V_{REF\_OUT}$, which is provided by the voltage bias circuit 406 in accordance with voltage $V_{REF}$.

Figure 5A:
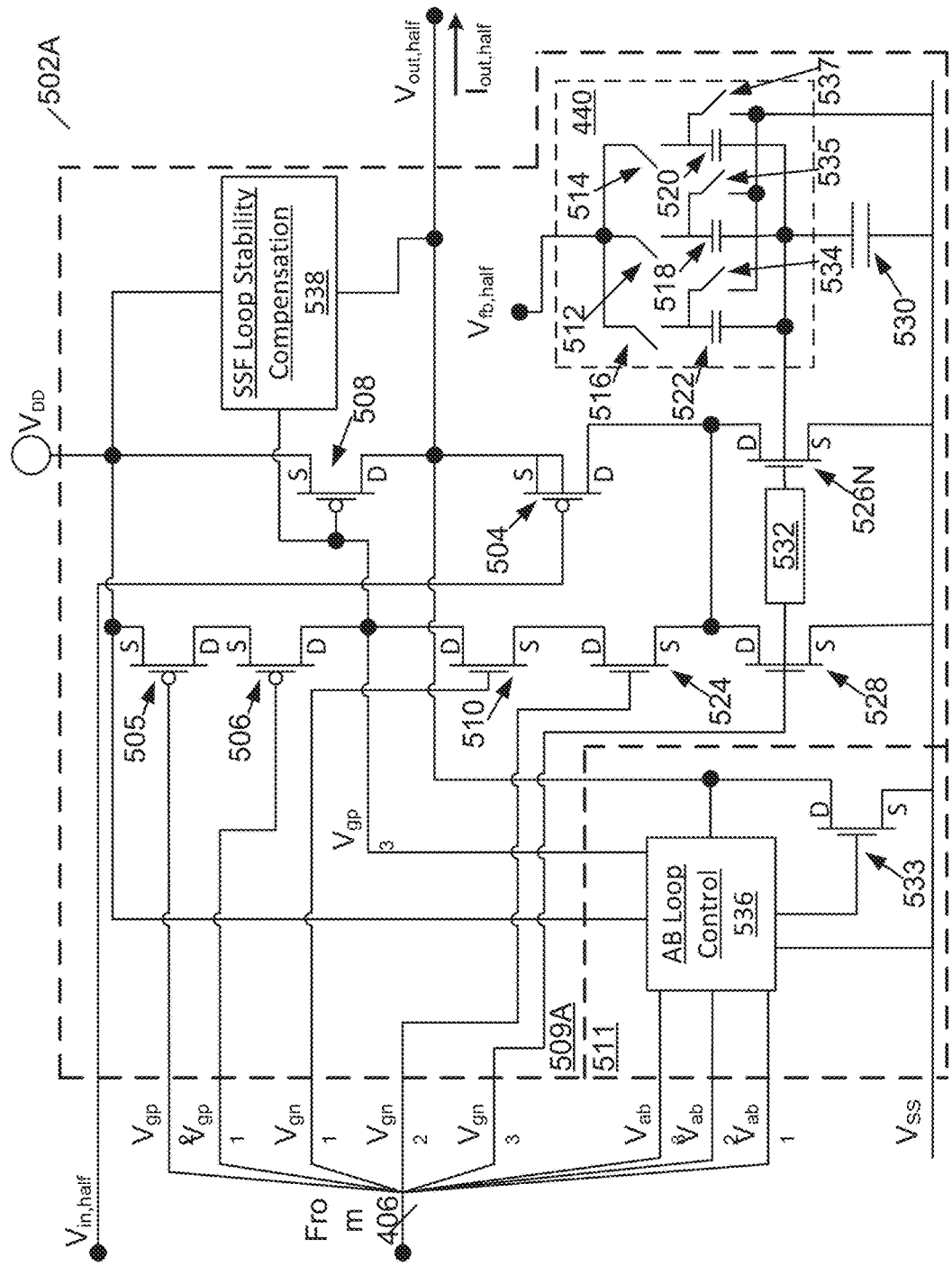
FIG. 5A is a block diagram that illustrates a Super Source Follower (SSF) stage that may be used in the amplifier circuit of FIG. 4, in accordance with one of a number of embodiments.

FIG. 5A illustrates an embodiment SSF stage 502A that may be used as either one of the input stages 402 or 404 of FIG. 4. SSF stage 502A receives an input voltage $V_{in,half}$ and provides an output signal having a voltage $V_{out,half}$ and a current $I_{out,half}$. In an embodiment, a first SSF stage 502A is used as the input stage 402 (shown in FIG. 4), where the voltages $V_{in,half}$, $V_{out,half}$, and $V_{fb,half}$ of this first SSF stage 502A are respectively the voltages $V_{in,p}$, $V_{out,p}$, and $V_{fb,p}$, and a second identical SSF stage 502A is used as the input stage 404 (also shown in FIG. 4), where the voltages $V_{in,half}$, $V_{out,half}$ and $V_{fb,half}$ of this second SSF stage 502A are respectively the voltages $V_{in,n}$, $V_{out,n}$, and $V_{fb,n}$. In such an embodiment, when switches 412 and 414 of FIG. 4 are closed, the amplifier circuit 401 of FIG. 4 is capable of providing a positive-dB gain relative to an amplifier circuit that uses input stage 502C of FIG. 5C, which lacks capacitive feedback. Additionally, in such an embodiment, when switches 416 and 418 of FIG. 4 are closed, the amplifier circuit 401 is capable of providing a negative-dB gain relative to an amplifier circuit that uses input stage 502C of FIG. 5C, which lacks capacitive feedback.

SSF stage 502A has an open-circuit voltage gain that is approximated by Equation 2 above, where $gm_{sf}$ is the transconductance of source follower transistor 504 of SSF stage 502A, and $gm_s$ is the transconductance of current biasing transistor 526N of SSF stage 502A. When configured for positive-dB gain, SSF stage 502A has a capacitive feedback coefficient that has a positive sign, according to Equation 1 above. When configured for negative-dB gain, SSF stage 502A has a capacitive feedback coefficient that has a negative sign, according to Equation 3 above.

SSF stage 502A includes an SSF feedback loop 509A and an AB mode feedback loop 511. SSF feedback loop 509A includes the source follower transistor 504, which in the embodiment of FIG. 5A is a PMOS transistor coupled to a load at its source. The SSF stage 502A provides an output current $I_{out,half}$ and an output voltage $V_{out,half}$ to the load. The gate of source follower transistor 504 is connected to the input of the SSF stage 502A to receive the input voltage $V_{in,half}$.

AB mode feedback loop 511 includes a transistor 533 that enables the SSF stage 502A to operate in class AB mode to support load current sinking. In the embodiment of FIG. 5A, this transistor 533 is an NMOS transistor having its drain coupled to the source of the source follower transistor 504 and to the output of the SSF stage 502A. Transistor 533 has its source coupled to the low-side rail voltage $V_{SS}$. Transistor 533 is controlled by an AB mode feedback loop that feeds back the output voltage $V_{out,half}$ from the output of SSF stage 502A to the input of an AB loop control stage 536. This AB loop control stage 536 also is connected to the low-end rail voltage $V_{SS}$ and receives AB loop bias voltages $V_{ab1}$, $V_{ab2}$, and $V_{ab3}$ from the voltage bias circuit 406 (shown in FIG. 4). The AB loop control stage provides a control voltage to the gate of transistor 533 to control the current through transistor 533 and thus to control the load sinking current $-I_{out,half}$ of SSF stage 502A. This load sinking current $-I_{out,half}$ would otherwise be limited by the sum of the biasing currents of transistor 526N and transistor 528, but the AB loop may force transistor 533 to increase this load sinking current without increasing the static current consumption of SSF stage 502A.

The drains of transistors 528 and 526N are connected to each other at a common drain node that is also connected to the drain of source follower transistor 504. The sources of transistors 528 and 526N are both connected to low-end rail voltage $V_{SS}$. The gates of transistors 528 and 526N are coupled to each other via a high-ohmic resistance stage 532. In some embodiments, resistance stage 532 may have a resistance on the order of, e.g., hundreds of giga-ohms and may include switchable diodes and/or transistors to allow current to be conducted only when the difference in voltage across the high-ohmic resistance stage 532 exceeds a predetermined threshold.

Referring again to FIG. 5A, transistor 528, which receives a biasing voltage $V_{gn3}$ from voltage bias circuit 406 at its gate, provides additional biasing current to source follower transistor 504 that is essentially constant despite varying levels of the feedback controlled current through transistor 526N. This biasing current is provided by transistor 528 to avoid the condition in which the source follower transistor 504 has no biasing current.

The feedback voltage $V_{fb,half}$ is fed back through feedback capacitance bank 440 to the gate of transistor 526N to change the current through transistor 526N. SSF feedback loop 509A also includes a loop around the source follower transistor 504 that is formed by n-channel Metal Oxide Semiconductor (NMOS) transistors 524 and 510 connected in series between the gate of transistor 508 and the common drain node of transistors 528 and 526N. The gates of transistor 524 and cascode transistor 510 are coupled to the voltage bias circuit 406 to respectively receive bias voltages of $V_{gn2}$ and $V_{gn1}$. The gate of transistor 508 is also connected to the drain of PMOS cascode transistor 506, which has its source connected to the drain of PMOS transistor 505, which in turn has its source connected to high-end rail voltage $V_{DD}$. The source of transistor 508 is also connected to voltage $V_{DD}$, and the drain of transistor 508 is connected to the source of source follower transistor 504, to the body of source follower transistor 504, and to the output of the SSF stage 502A. The gate of transistor 506 is connected to a bias voltage $V_{gp1}$, and the gate of transistor 505 is connected to a bias voltage $V_{gp2}$. The gate of transistor 508 is also connected to an output of an SSF stability compensation stage 538. The output voltage $V_{out,half}$ is fed back as an input to the SSF stability compensation stage 538.

Collectively, transistors 505, 506, 510, 524, 526N, and 528, and SSF stability compensation stage 538 provide a control voltage at the gate of transistor 508. This gate voltage controls transistor 508 to keep the current through the source follower transistor 504 essentially constant despite varying current $I_{out,half}$ provided to the load, thus resulting in a low output impedance for the SSF stage 502A.

Relative to input stages 102 and 104 of FIGS. 1A and 1B, which have a simple source follower topology, the more complex SSF stage 502A may allow decreased output impedance and improved power supply rejection and driving capability, while minimizing any increase in current consumption and noise contribution. For example, when no signal is fed back by the capacitive network 440, i.e. $C_f$=0, transistor 526N works as a constant current source and the SSF feedback loop 509A drives the gate of transistor 508 in order to maintain a constant current through the source follower device 504 despite the current required by the load. Under such conditions, as $V_{in,half}$ respectively increases or decreases at the gate of source follower transistor 504, the current of source follower transistor 504 cannot increase or decrease, and thus the output voltage $V_{out,half}$ at the source of source follower transistor 504 increases or decreases such that the previous source-to-gate voltage of source follower transistor 504 is maintained. In another example, when $C_f \neq 0$, the current of transistor 526N varies proportionally to $V_{fb,half}$, and therefore the current of the source follower device 504 is forced to follow the varying biasing current of transistor 526N. Under these conditions, the gate to source voltage of the source follower transistor 504 does not stay constant but instead tracks the current behavior. Depending on the phase of $V_{fb,half}$, which is coupled to one of the two differential outputs, this current variation can have same or opposite phase compared to signal $V_{in,half}$. In the case where the current variation through transistor 526N has the same phase relative to the input signal $V_{in,half}$, voltage amplification is obtained at the source of the source follower transistor 504 relative to its gate, which are an output and an input of the SSF stage 502A, respectively. In the opposite case where the current variation through transistor 526N has the opposite phase relative to the input signal $V_{in,half}$, voltage attenuation is obtained. Amplification or attenuation through SSF stage 502A is thus proportional to the amplitude of the current variation of the current source 526N.

The feedback capacitance bank 440, which has a total capacitance $C_f$, includes a capacitance 522 in series with a switch 516, a capacitance 518 in series with a switch 512, and a capacitance 520 in series with a switch 514. Each of these capacitance-switch pairs are connected between the feedback voltage $V_{fb,half}$ and the gate of transistor 526N. The gate of transistor 526N is also connected to a capacitance bank 530 having a capacitance of $C_p$. This capacitance bank 530 is connected between the gate of transistor 526N and voltage $V_{SS}$. By selectively closing one or more of switches 516, 512, and 514, the capacitance $C_f$ of feedback capacitance bank 440 may be trimmed to provide a configurable gain or attenuation for the amplifier circuit 401 (shown in FIG. 4), depending on the open/closed state of switches 412, 414, 416, and 418 of FIG. 4.

The feedback capacitance bank 440 also includes switches 534, 535, and 537, which are each coupled between voltage $V_{SS}$ and, respectively, the junctions of the capacitance-switch pairs 522-516, 518-512, and 520-514. By opening all the switches 516, 512, and 514 and closing all the switches 534, 535, and 537, a non-feedback configuration is provided for the amplifier circuit 401 (shown in FIG. 4). The common node between switches 516 and 534 must be connected either to $V_{fb,half}$ or $V_{SS}$, hence, the switches need to be alternatively closed. The same is true for the common nodes between 512 and 535, 514 and 537.

Figure 5B:
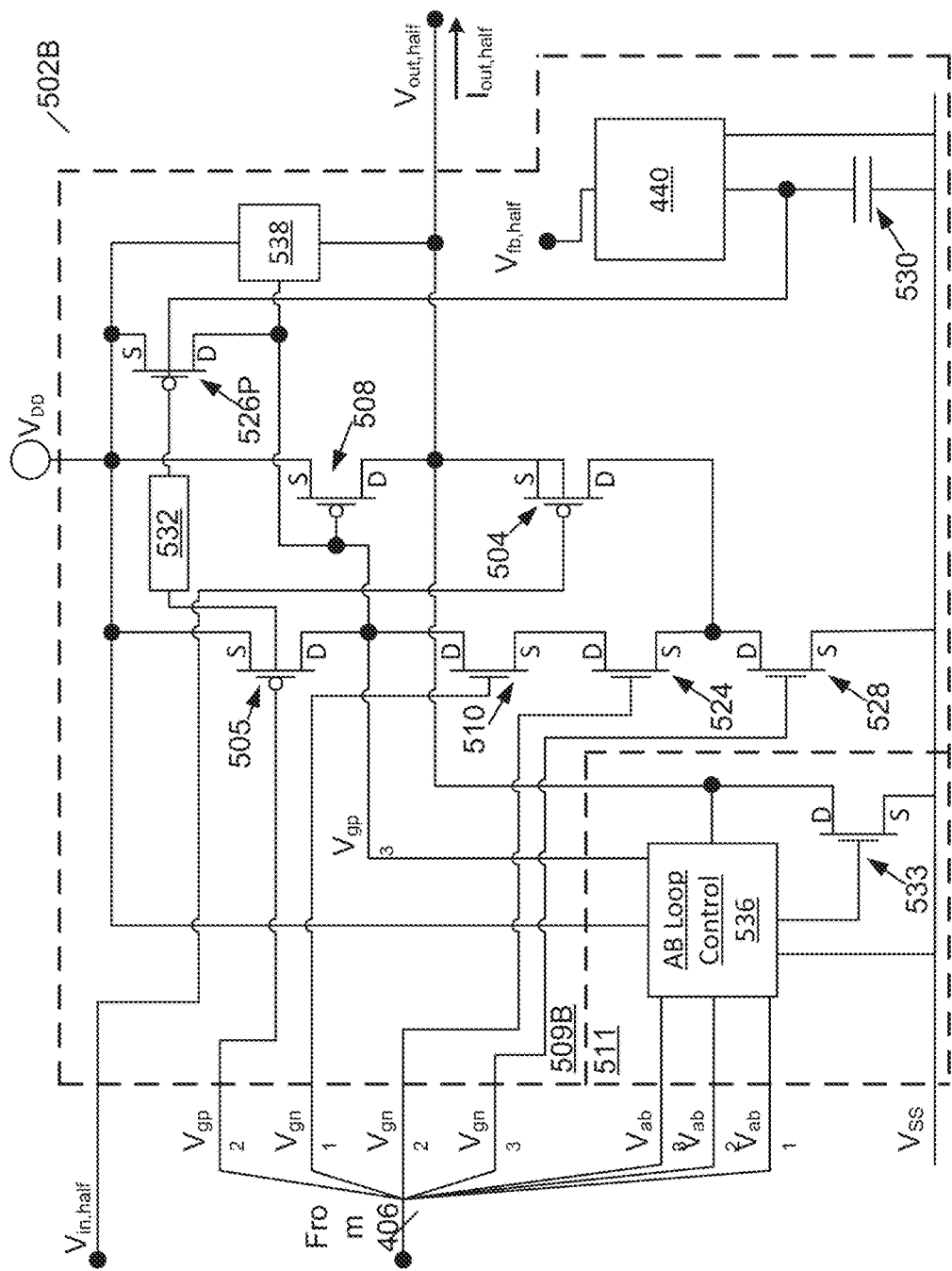
FIG. 5B is a block diagram that illustrates an alternative SSF stage that may be used in the amplifier circuit of FIG. 4, in accordance with one of a number of embodiments.
Figure 5C:
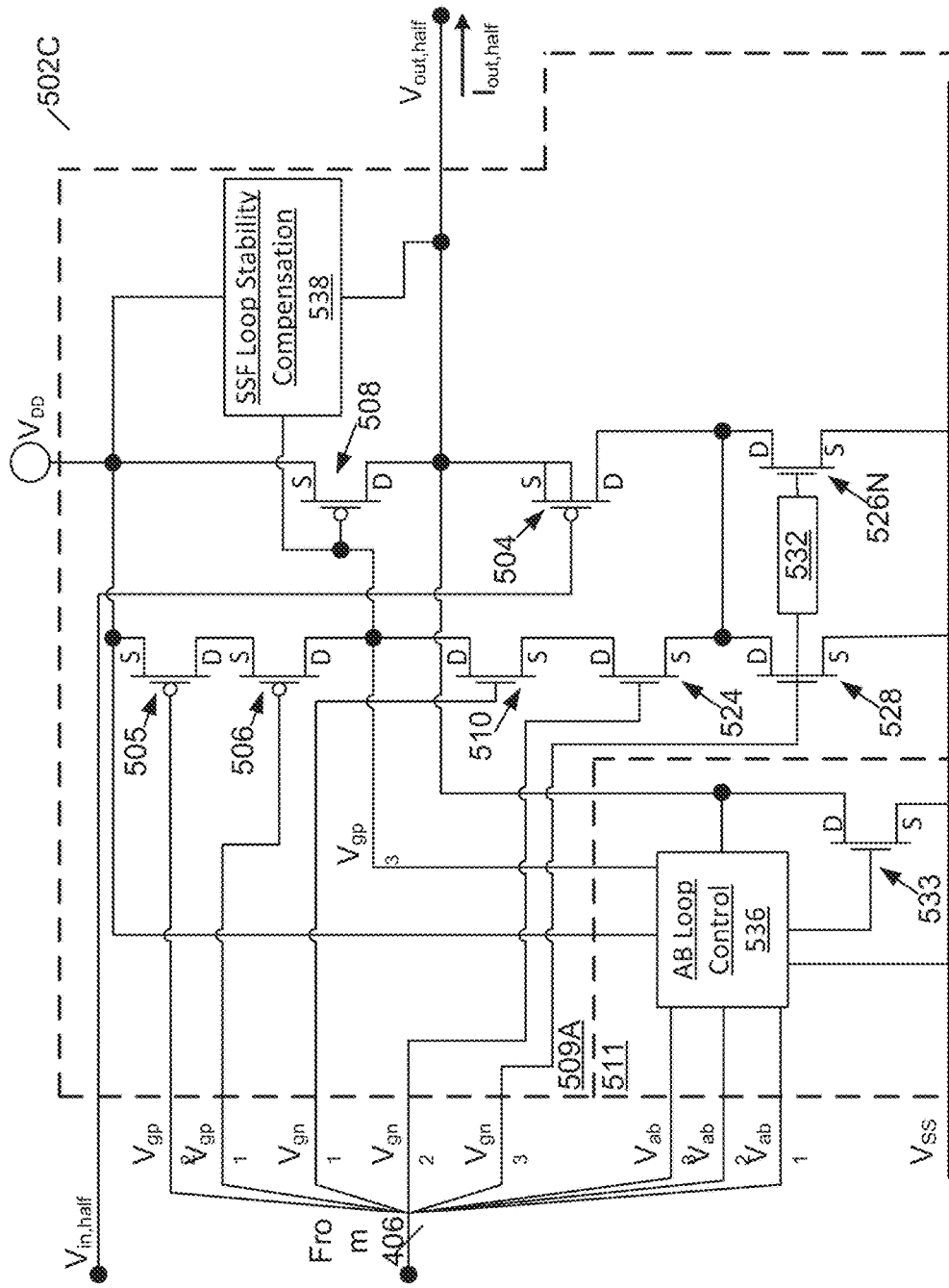
FIG. 5C is a block diagram that illustrates an SSF stage that lacks capacitive feedback, in accordance with one of a number of embodiments.

FIG. 5B illustrates an alternative embodiment SSF stage 502B that may be used as either of the input stages 402 or 404 of FIG. 4. SSF stage 502B of FIG. 5B differs from SSF stage 502A of FIG. 5A in that feedback-controlled NMOS current biasing transistor 526N has been replaced with feedback-controlled PMOS current biasing transistor 526P, which is relocated to the PMOS section of SSF stage 502B in the upper part of the SSF feedback loop 509B, but which still has its gate connected to the junction of feedback capacitance bank 440 and capacitance bank 530.

In the SSF feedback loop 509B of FIG. 5B, the source of current biasing transistor 526P is also connected to voltage $V_{DD}$ instead of to transistor 528, and the drain of current biasing transistor 526P is connected to the drain of transistor 505 and the gate of current source transistor 508 instead of to voltage $V_{SS}$. Transistor 506 has also been removed, and the drain of transistor 505 has been connected directly to the gate of transistor 508. The high-ohmic resistance stage 532 has also been relocated to the upper PMOS section of SSF stage 502B, where it is connected between the gates of current biasing transistor 526P and transistor 505.

Figure 5D:
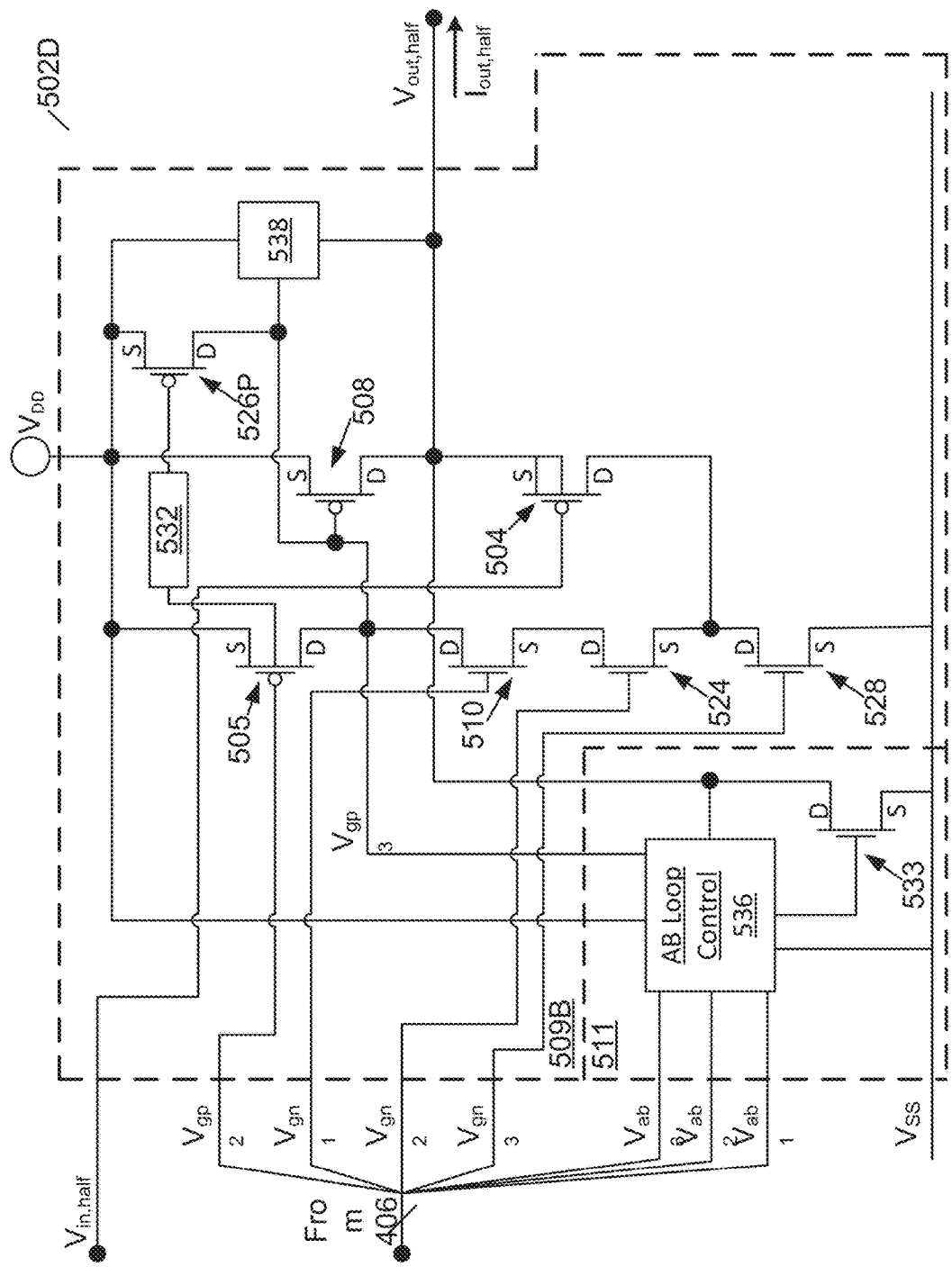
FIG. 5D is a block diagram that illustrates a second SSF stage that lacks capacitive feedback, in accordance with one of a number of embodiments.

In SSF feedback loop 509B, the current through current biasing transistor 526P varies in accordance with the configurable capacitance of the feedback capacitance bank 440, and thus the gain or attenuation varies in accordance with this feedback capacitance. In an embodiment, a first SSF stage 502B is used as the input stage 402 (shown in FIG. 4), where the voltages $V_{in,half}$, $V_{out,half}$ and $V_{fb,half}$ of this first SSF stage 502B are respectively the voltages $V_{in,p}$, $V_{out,p}$, and $V_{fb,p}$, and a second identical SSF stage 502B is used as the input stage 404 (also shown in FIG. 4), where the voltages $V_{in,half}$, $V_{out,half}$ and $V_{fb,half}$ of this second SSF stage 502B are respectively the voltages $V_{in,n}$, $V_{out,n}$, and $V_{fb,n}$. In such an embodiment, when switches 412 and 414 of FIG. 4 are closed, the amplifier circuit 401 of FIG. 4 is capable of providing a negative-dB gain relative to an amplifier circuit that uses input stage 502D of FIG. 5D, which lacks capacitive feedback. Additionally, in such an embodiment when switches 416 and 418 of FIG. 4 are closed, the amplifier circuit 401 is capable of providing a positive-dB gain relative to an amplifier circuit that uses input stage 502D of FIG. 5D, which lacks capacitive feedback.

SSF stage 502B has an open-circuit voltage gain that is approximated by Equation 2 above, where $gm_{sf}$ is the transconductance of source follower transistor 504, and $gm_s$ is the transconductance of current biasing transistor 526P of SSF stage 502B. When configured for positive-dB gain, SSF stage 502B has a capacitive feedback coefficient with a positive sign, according to Equation 1 above. When configured for negative-dB gain, SSF stage 502B has a capacitive feedback coefficient with a negative sign, according to Equation 3 above.

Figure 6:
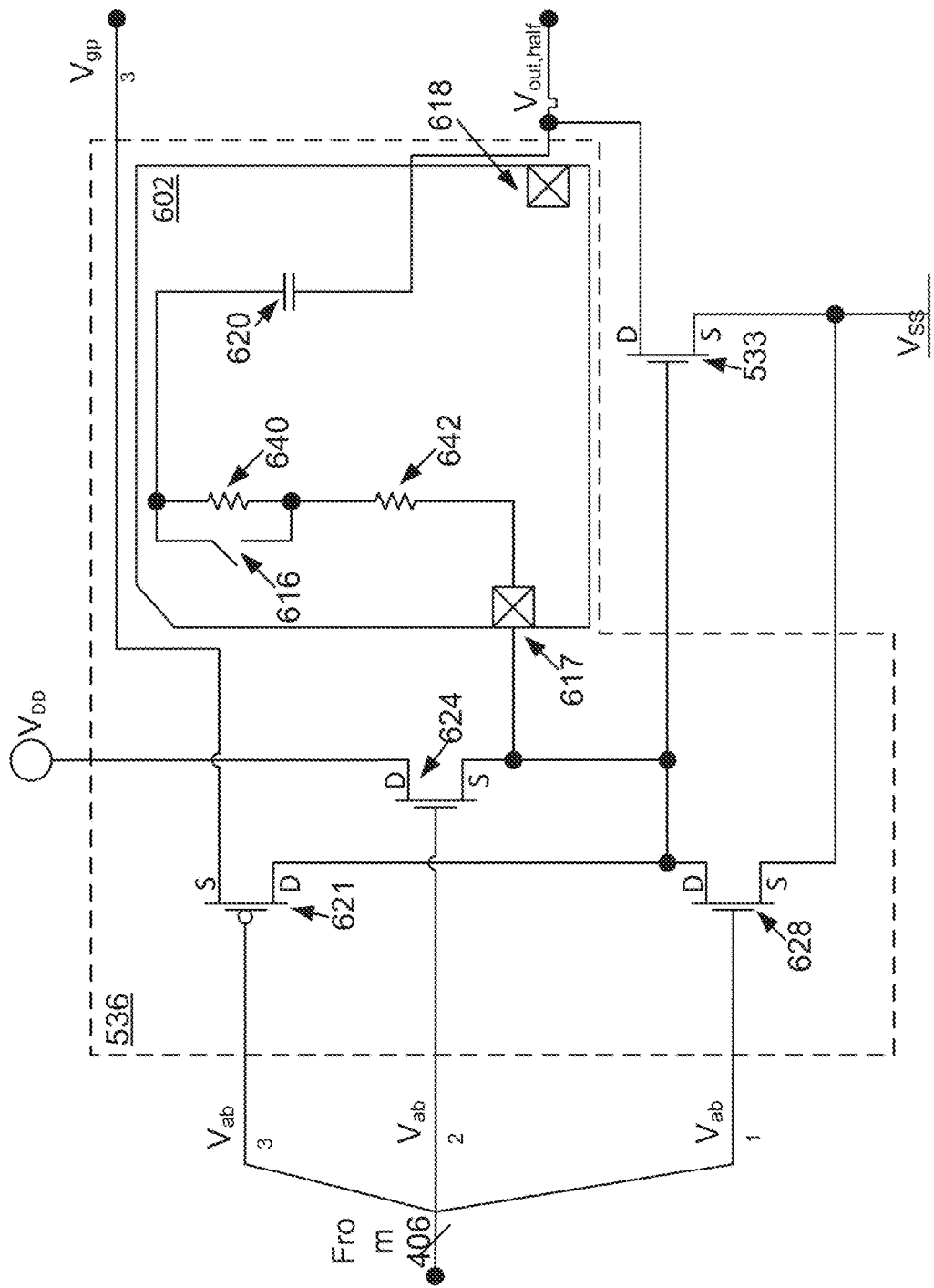
FIG. 6 is a block diagram that illustrates a control stage for a class AB output loop that may be used in the SSF stage of FIG. 5A or FIG. 5B, in accordance with one of a number of embodiments.

FIG. 6 shows an embodiment of the AB loop control stage 536 of FIG. 5A and FIG. 5B. The AB loop control stage 536, which includes a stability compensation stage 602, a PMOS transistor 621, and NMOS transistors 624 and 628, controls the gate of AB loop transistor 533.

The AB loop control stage 536 receives voltage $V_{ab1}$, $V_{ab2}$, and $V_{ab3}$ from the voltage bias circuit 406. Voltage $V_{ab1}$ is received at the gate of transistor 628, voltage $V_{ab2}$ is received at the gate of transistor 624, and Voltage $V_{ab3}$ is received at the gate of transistor 621.

The drain of transistor 628 is coupled to the drain of transistor 621, to the stability compensation stage 602, and to the gate of transistor 533 of FIG. 5A and FIG. 5B. The source of transistor 628 is connected to voltage $V_{SS}$. The voltage $V_{gp3}$ of FIG. 5A and FIG. 5B is provided at the source of transistor 621, and the drain of transistor 624 is connected to voltage $V_{DD}$.

The stability compensation stage 602 includes terminals 617 and 618, resistors 640 and 642, capacitance 620, and bypass switch 616. The stability compensation stage 602 is a Miller compensation stage that provides feedback from the output voltage $V_{out,half}$ to ensure sufficient phase margin for the AB loop.

Voltage $V_{out,half}$ is received at terminal 618 of the stability compensation stage 602, which is connected to an input of capacitor 620. Capacitor 620 and resistors 640 and 642 are connected in series from the terminal 618 to terminal 617 of stability compensation stage 602, which is connected to the source of transistor 624. A bypass switch 616 connected in parallel with resistor 640 may be configured to bypass resistor 640 when the amplifier circuit 401 (shown in FIG. 4) is in low-power mode.

Figure 7:
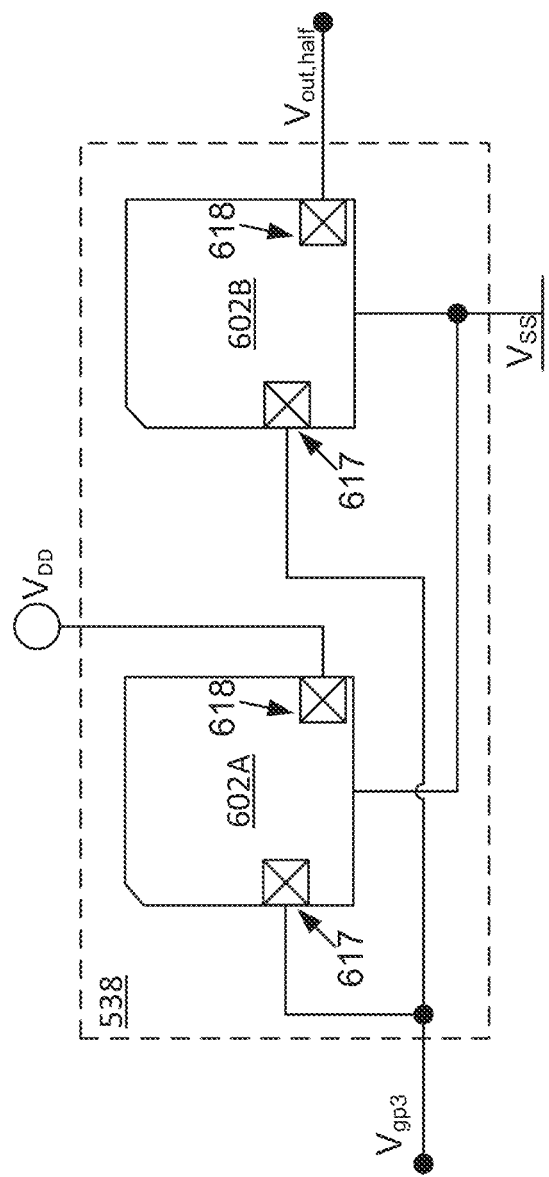
FIG. 7 is a block diagram that illustrates an SSF loop stability compensation stage loop that may be used in the SSF stage of FIG. 5A or FIG. 5B, in accordance with one of a number of embodiments.

FIG. 7 shows an embodiment of the SSF loop stability compensation stage 538 of FIG. 5A and FIG. 5B. SSF loop stability compensation stage 538 includes the stability compensation stage 602 of FIG. 6 that has been implemented as two separate stability compensation stages 602A and 602B, which are both connected to rail voltage $V_{SS}$. The SSF loop stability compensation stage 538 feeds back a stability compensation signal to stabilize the SSF feedback loop 509A of FIG. 5A and FIG. 5B.

The SSF loop stability compensation stage 538 receives the output voltage $V_{out,half}$ at terminal 618 of stability compensation stage 602B. Terminal 617 of stability compensation stage 602B is coupled at a common node to terminal 617 of stability compensation stage 602A. Terminal 618 of stability compensation stage 602A is coupled to voltage $V_{DD}$. The common node of stability compensation stages 602A has the voltage $V_{gp3}$.

Figure 8:
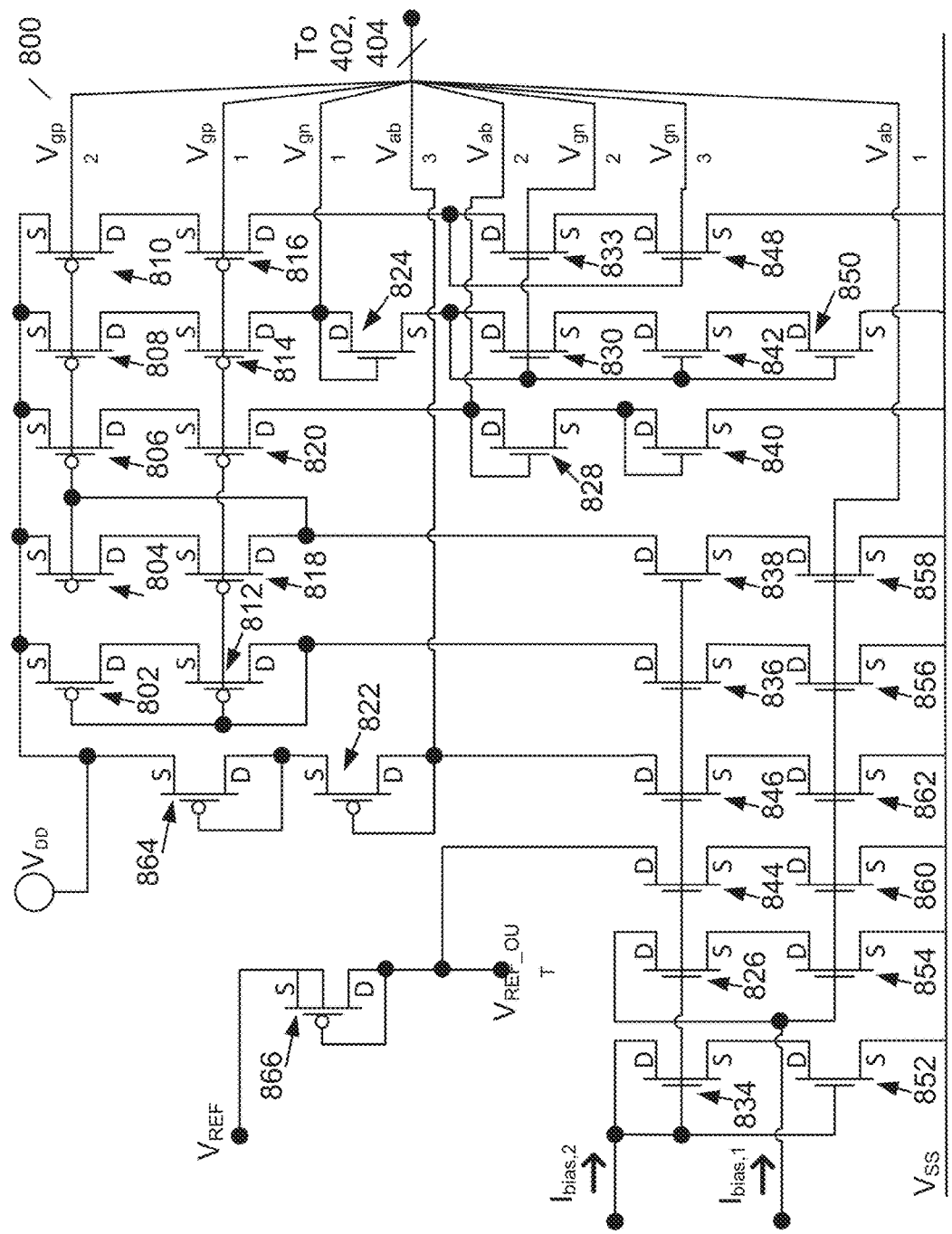
FIG. 8 is a block diagram that illustrates a voltage generator circuit that may be used as the reference voltage generator of FIG. 4, in accordance with one of a number of embodiments.

FIG. 8 shows a voltage bias circuit 800 that may be used as the voltage bias circuit 406 of FIG. 4. Voltage bias circuit 800 provides output voltages $V_{ab1}$, $V_{ab2}$, $V_{ab3}$, $V_{gn3}$, $V_{gn2}$, $V_{gn1}$, $V_{gp1}$, and $V_{gp2}$. Voltage bias circuit 800 receives voltage $V_{REF}$ at the source of a diode connected PMOS transistor 866 that has a gate to drain connection and also a bulk to source connection. PMOS transistor 866 is biased with a current source formed by transistors 860 and cascode transistor 844. The DC level at the gate to drain connection of transistor 866 is, therefore, $V_{REF}-V_{th,866}$, where $V_{th,866}$ is the threshold voltage of transistor 866. The gate and drain of transistor 866 are then connected to one of the high-ohmic resistance stages 422 of FIG. 4. In embodiments in which each of the input stages 402 and 404 of FIG. 4 are implemented using a source follower device (e.g., transistor 504 of FIGS. 5A-5D), the DC output level of input stages 402 and 404 is $V_{REF}-V_{th,866}+V_{th,SF}$, where $V_{th,SF}$ is the threshold voltage of the source follower device. In an embodiment, the two threshold voltages $V_{th,866}$ and $V_{th,SF}$ are configured to be equal; hence the DC output level of input stages 402 and 404 is equal to the compensated reference voltage $V_{REF}$.

The source of transistor 844 is coupled to the drain of an NMOS transistor 860. The gate of transistor 844 is coupled to the drain of and to the gate of an NMOS transistor 834 and to the respective gate of each of additional NMOS transistors 852, 826, 846, 836, and 838. The gate of transistor 860 is coupled to the drain of transistor 826 and to the respective gate of each of NMOS transistors 854, 862, 856, and 858. The sources of transistors 834, 826, 844, 846, 836, and 838 are respectively coupled to the drains of transistors 852, 854, 860, 862, 856, and 858. The sources of transistors 852, 854, 860, 862, 856, and 858 are coupled to voltage $V_{SS}$. Current $I_{bias,1}$ is provided to the junction of the drain of transistor 826 and the gate of transistor 854. Current $I_{bias,2}$ is provided to the junction of the drain and gate of transistor 834.

The drain of transistor 846 is coupled to the drain of and gate of a PMOS transistor 822. The drain of transistor 836 is coupled to the drain of and gate of a PMOS transistor 812 and to the respective gate of each of additional PMOS transistors 802, 818, 820, 814, and 816. The drain of transistor 838 is coupled to the drain of transistor 818 and to the respective gates of each of additional PMOS transistors 804, 806, 808, and 810. The source of transistor 822 is connected to the drain and gate of PMOS transistor 864. The sources of transistors 812, 818, 820, 814, and 816 are respectively coupled to the drains of transistors 802, 804, 806, 808, and 810. The sources of transistors 802, 804, 806, 808, 810, and 884 are coupled to voltage $V_{DD}$. The drain of transistor 820 is coupled to the drain and gate of NMOS transistor 828. The source of transistor 828 is coupled to the drain and gate of NMOS transistor 840.

The drain of transistor 814 is coupled to the drain and gate of NMOS transistor 824. The source of transistor 824 is coupled to the drain and gate of NMOS transistor 830, to the gate of NMOS transistor 842, and the gate of NMOS transistor 850. The source of transistor 830 is coupled to the drain of transistor 842, and the source of transistor 842 is coupled to the drain of transistor 850. The drain of transistor 816 is coupled to the drain of NMOS transistor 833 and to the gate of NMOS transistor 848. The source of transistor 833 is coupled to the drain of transistor 848. The sources of transistors 840, 850, and 848 are coupled to voltage $V_{SS}$.

Voltage $V_{gp2}$ is provided at the drain of transistor 818, and voltage $V_{gp1}$ is provided at the drain of transistor 812. Voltage $V_{gn1}$ is provided at the drain of transistor 824, voltage $V_{gn2}$ is provided at the drain of transistor 830, and voltage $V_{gn3}$ is provided at the drain of transistor 833. Voltage $V_{ab3}$ is provided at the drain of transistor 822, voltage $V_{ab2}$ is provided at the drain of transistor 828, and voltage $V_{ab1}$ is provided at the drain of transistor 826.

Figure 9:
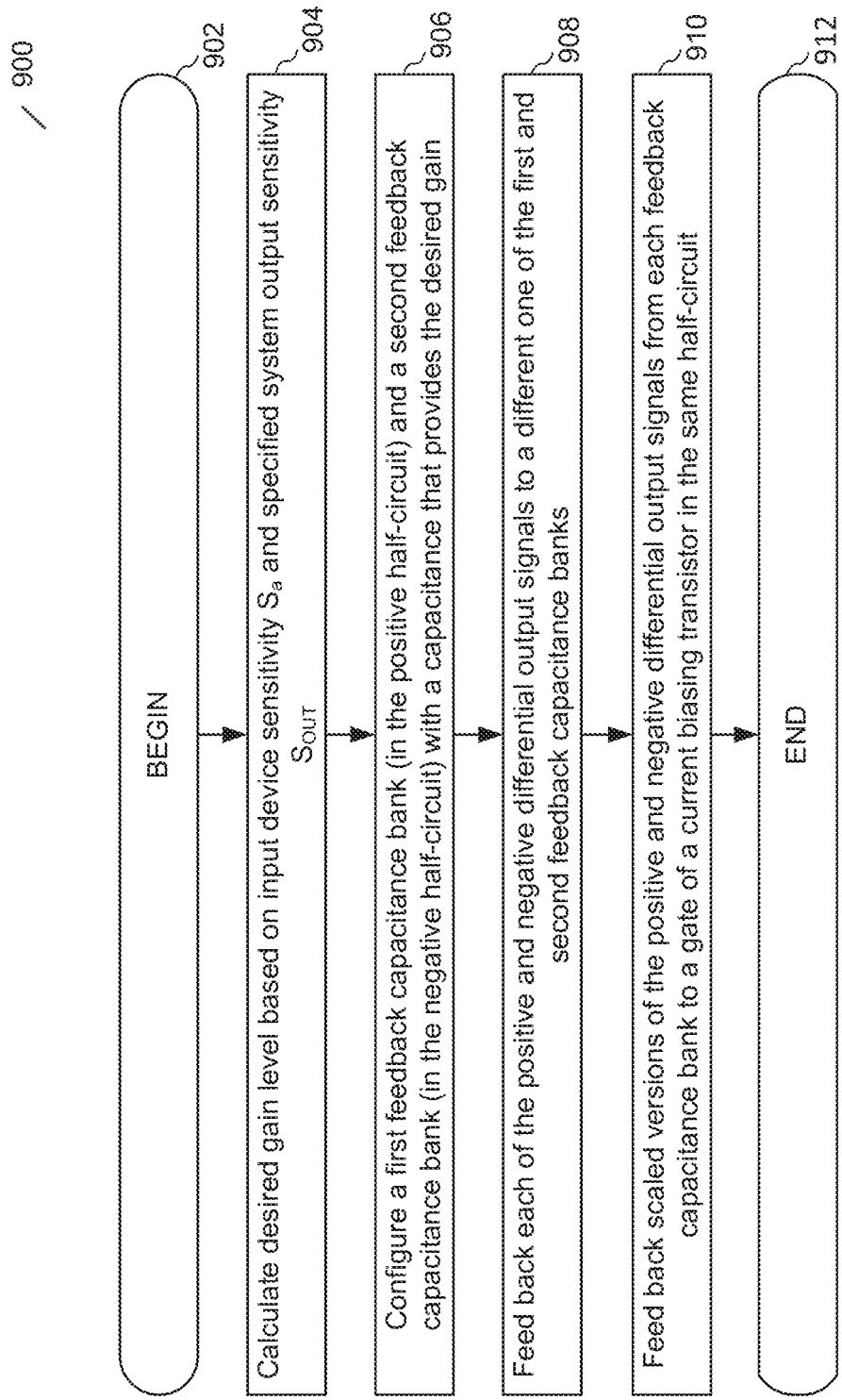
FIG. 9 is a flow diagram illustrating a method for providing a capacitive feedback, in accordance with one of a number of embodiments.

FIG. 9 is a flow diagram illustrating a method 900 for providing a capacitive feedback. In the method 900, an amplifier circuit having a source follower or SSF topology is enhanced with a capacitive feedback in order to have a configurable gain that may be either a positive-dB gain or a negative-dB gain relative to an amplifier without the capacitive feedback.

The method 900 begins at step 902. At step 904, a desired gain level is calculated based on an output sensitivity $S_a$ of an input device that is connected to the amplifier circuit, such that a specified output sensitivity $S_{OUT}$ of the overall system output signal may be achieved with minimal excess gain. At step 906, a first and second feedback capacitance bank are both configured with a capacitance that provides the desired gain level. The first feedback capacitance bank is included in a first subcircuit of the amplifier circuit, and the second feedback capacitance bank is included in a second subcircuit of the amplifier circuit. At step 908, a first one of the differential output signals of the amplifier circuit is fed back to the first feedback capacitance bank and the other differential output signal is fed back to the second feedback capacitance bank. The selection of which of the positive and negative differential output signals is fed back to each feedback capacitance bank is based on whether the desired gain level is a positive-dB gain or an attenuation relative to a non-feedback gain level of an amplifier without capacitive feedback. At step 910, a scaled version of the first differential output signal is provided from the first feedback capacitance bank to a gate of a first current biasing transistor that is included in the first subcircuit, and a scaled version of the second differential output is fed back from the second feedback capacitance bank to a gate of a second current biasing transistor that is included in the second subcircuit. Each of these current biasing transistors controls current that flows through transistors of the respective subcircuit, these transistors including a respective source follower transistor. The configurable gain or attenuation varies in accordance with the amplitude of the variation of the current through the current biasing transistor. The method 900 ends at step 912.

Figure 10:
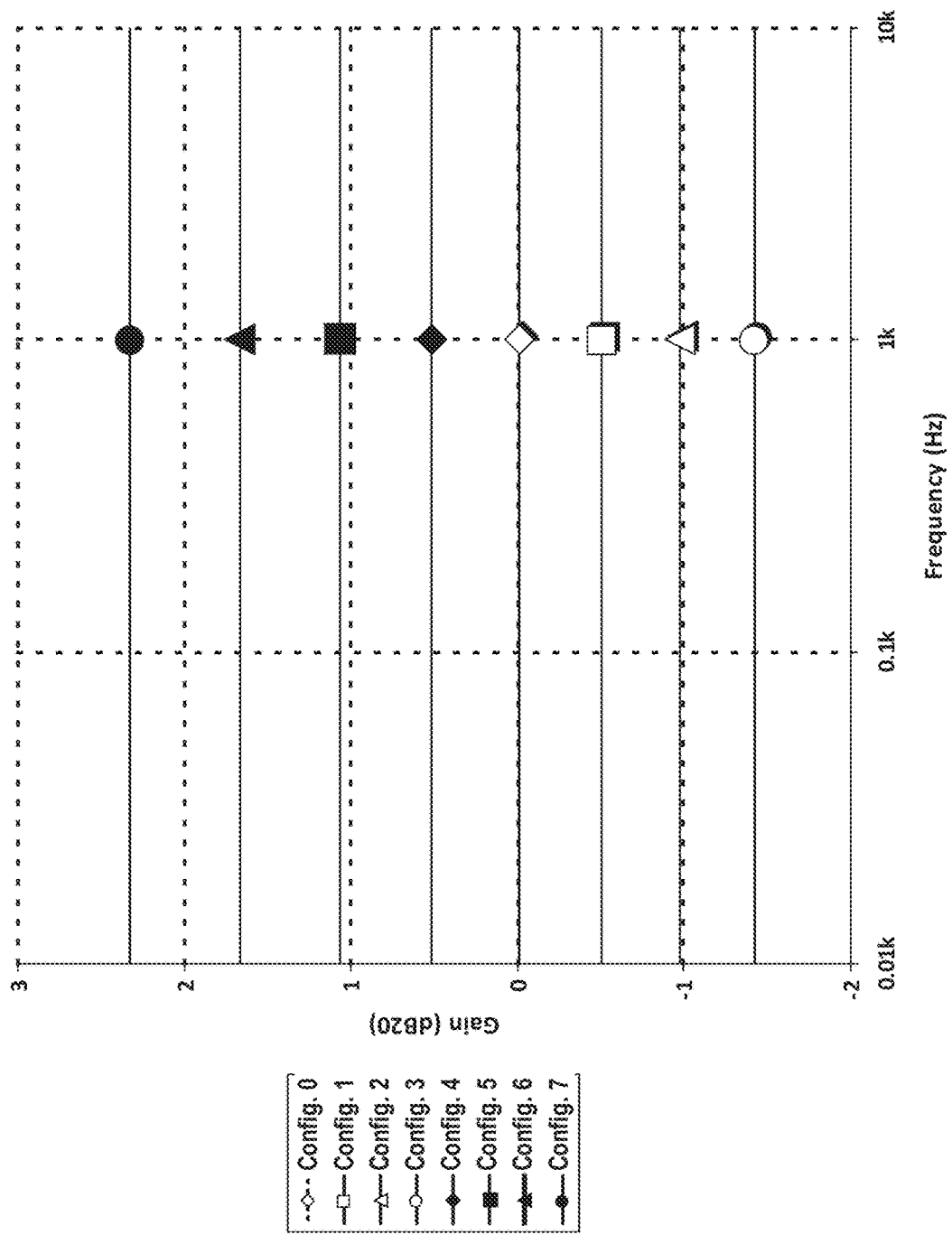
FIG. 10 is a graph that illustrates several differential transfer curves for the SSF stage of FIG. 5A at different feedback capacitances, in accordance with one of a number of embodiments.

FIG. 10 illustrates several AC differential transfer curves for the SSF stage 502A at different configurations of the feedback capacitance bank 440 when the SSF stage 502A is used in normal power mode as the input stages 402 and 404 of amplifier circuit 401. The differential gain is plotted against input signal frequency for each of eight different configurations of the low-pass capacitance $C_p$, and the feedback capacitance $C_f$ which are both on the order of picofarads (pF). The value of the differential gain for each of these configurations is also provided in Table I below:

TABLE I

Differential Gain at 1 kHz for Eight Different Configurations

| Configuration No. | $C_p$ | $C_f$ | Gain at 1 kHz (Normal Power) |
|---|---|---|---|
| 0 | 7 pF | 0 pF | −0.12 dB |
| 1 | 5.5 pF | 1.5 pF | −0.51 dB |
| 2 | 4 pF | 3 pF | −0.98 dB |
| 3 | 2.5 pF | 4.5 pF | −1.42 dB |

TABLE I-continued

Differential Gain at 1 kHz
for Eight Different Configurations

| Configuration No. | $C_p$ | $C_f$ | Gain at 1 kHz (Normal Power) |
|---|---|---|---|
| 4 | 5.5 pF | 1.5 pF | 0.51 dB |
| 5 | 4 pF | 3 pF | 1.07 dB |
| 6 | 2.5 pF | 4.5 pF | 1.67 dB |
| 7 | 1 pF | 6 pF | 2.32 dB |

The dashed curve in FIG. 10 is the non-feedback configuration ($C_f$=0 pF) obtained with all the switches 516, 512 and 514 (shown in FIG. 5A) open and all the switches 534,535 and 537 closed. The four solid curves above the dashed curve are obtained with switches 412 and 414 closed. The three dotted curves below the dashed curve were obtained with switches 416 and 418 closed.

Figure 11:
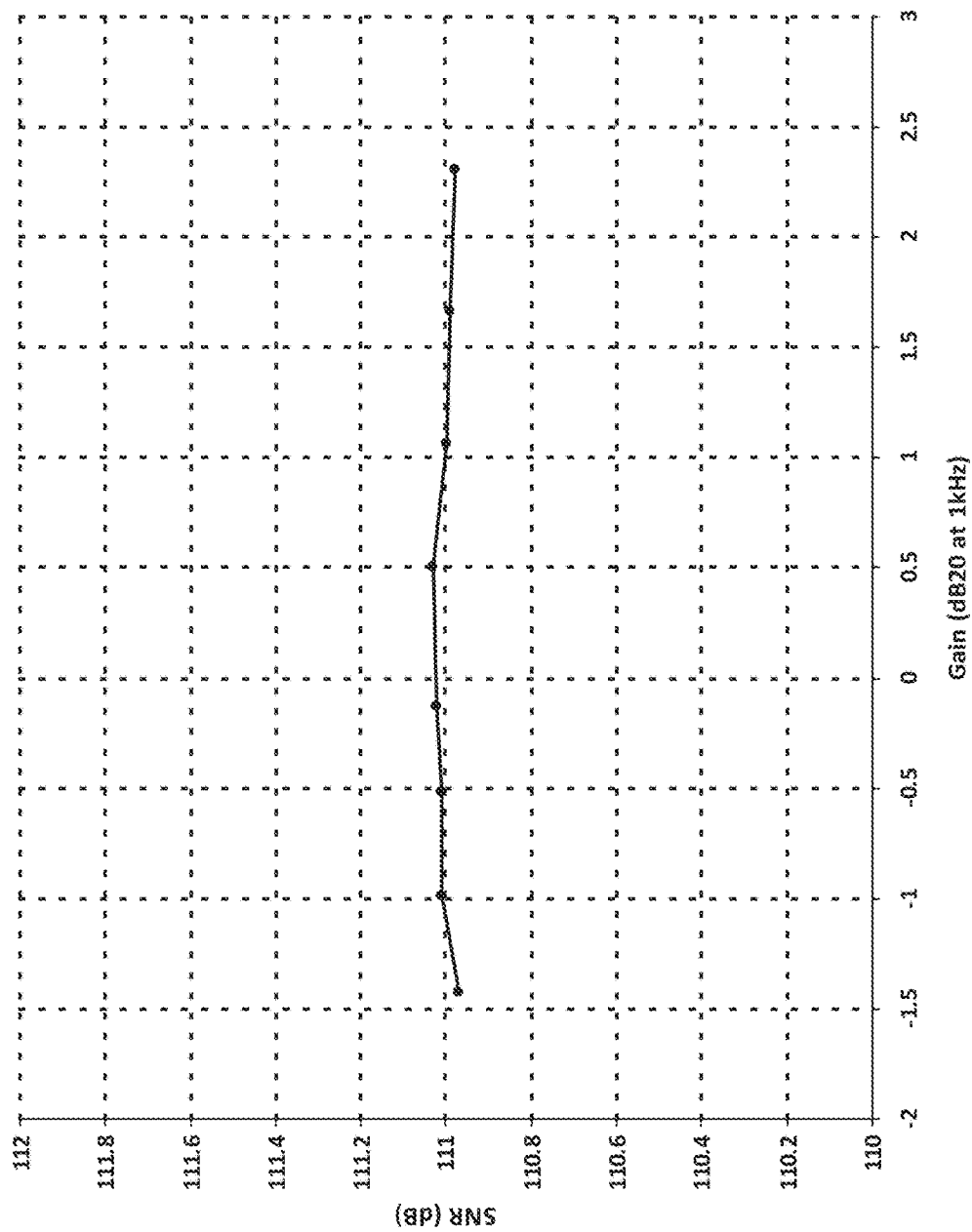
FIG. 11 is a graph that illustrates the Signal-to-Noise Ratio (SNR) of an implementation of the amplifier circuit of FIG. 4, in accordance with one of a number of embodiments.

FIG. 11 illustrates the Signal-to-Noise Ratio (SNR) as a function of the gain configuration of an ASIC that implements the amplifier circuit 401 using the SSF stage 502A as the input stages 402 and 404. The plot of FIG. 11 shows that the ASIC SNR does not depend on the selected gain. Thus, in embodiments where the amplifier circuit 401 is used in an amplification system having a specified output sensitivity and where the input device is, for example, a MEMS microphone, the appropriate gain configuration may be chosen in accordance with the MEMS sensitivity.

Figure 12:
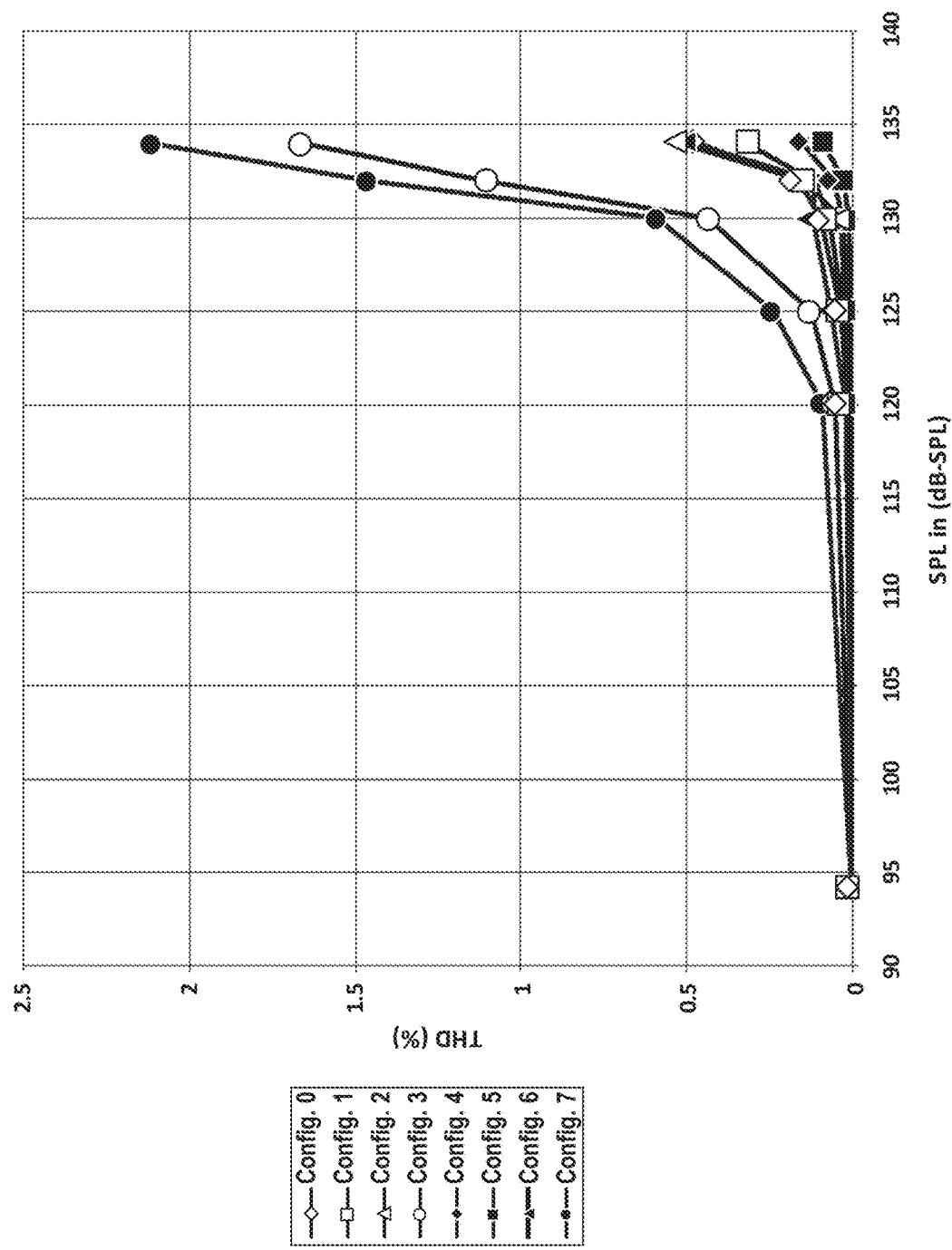
FIG. 12 is a graph that illustrates the simulated Total Harmonic Distortion (THD) for different gain configurations of the amplifier circuit of FIG. 4, in accordance with one of a number of embodiments.

FIG. 12 shows the simulated ASIC Total Harmonic Distortion (THD) over Sound Pressure Level (SPL) for different gain configurations for an embodiment ASIC implementing the amplifier circuit 401 in an amplification system for the MEMS microphone 324 where the SSF stage 502A is used as the input stages 402 and 404. The THD is measured at the differential output terminals 413 and 415 of amplifier circuit 401, and the SPL is measured at the differential input of amplifier 401. The differential output sensitivity is set to −38 dBV-rms for an input of 94 dB-SPL (which corresponds to 1 Pascal-rms (Pa-rms)) by changing the differential amplitude at the input of amplifier 401. The lowest gain configuration is indicated by the dashed line in FIG. 12 and the highest gain configuration is indicated by the dotted line. Even though these lowest and highest gain configurations have the worst linearity, the highest gain configuration still has an acceptable THD of approximately 0.6% THD at 130 dB-SPL, and the lowest gain configuration has an even lower THD of approximately 0.45% THD at 130 dB-SPL.

Illustrative embodiments of the present invention have the advantage of providing not only positive-dB gain but also attenuation. In some embodiments, a feedback path with adjustable capacitance is provided from an amplifier output to a source-follower or SSF stage to provide configurable gain or attenuation. In some embodiments, a configurable gain is provided to overcome reduced microphone sensitivity due to the limitations of a smaller package size for a MEMS microphone. In some embodiments, an amplifier having a configurable gain or attenuation allows sensors in a sensor read-out system to operate at low voltage supplies, with low noise and low power consumption, while also showing good linearity even when high input signals are applied.

Embodiments of present invention may also be adapted to provide AC coupling between input device 124 and inputs of various embodiment amplifier circuits described above. For example, in embodiments in which input device 124 is a capacitive sensor, such as a MEMS microphone, AC coupling may be used to reject leakage current-induced offset voltages caused by dust particles, humidity or water exposure, as such uncorrected offset voltages in a DC coupled system may decrease the performance an ADC coupled to the output of an amplifier circuit. The presence of an offset voltage may also saturate the amplifier, limit the usable dynamic range of the amplifier, and/or limit the maximum gain of the amplifier. This may have an adverse effect on noise performance, because limiting the gain of the amplifier to avoid saturation may also limit the ability to use a high amplifier gain to reduce system noise.

While using an AC coupling capacitor may be used to reduce offset, introducing an AC coupling capacitor in the signal path of embodiment amplification systems creates some design challenges. One such challenge is most practical on-chip capacitor structures have, in addition to the desired capacitance, a parasitic capacitance may load the signal path and attenuate the signal. While this parasitic induced signal attenuation could be compensated by increasing the gain of the amplifier, operating the amplifier at an increased gain may degrade the linearity of the amplifier due to increased signal swing at the gate of current source biasing transistors 110 (FIGS. 13A and 13B) causing a larger non-linear transimpedance of current biasing transistors 110.

In embodiments of the present invention, the parasitic capacitance of the AC coupling capacitor is coupled to an output of the amplifier such that the parasitic capacitance is driven in-phase with the input signal. By driving the parasitic capacitance in-phase with the input signal, the effective loading on the amplifier is advantageously reduced or eliminated. In some embodiments, an additional feedback capacitance is coupled in parallel with the parasitic capacitance of the AC coupling capacitor. This additional capacitance can be used to advantageously optimize the feedback path to further reduce parasitic input loading both from the parasitic capacitance of the AC coupling capacitor and other parasitics and/or to further increase the gain of the system.

Figure 13A:
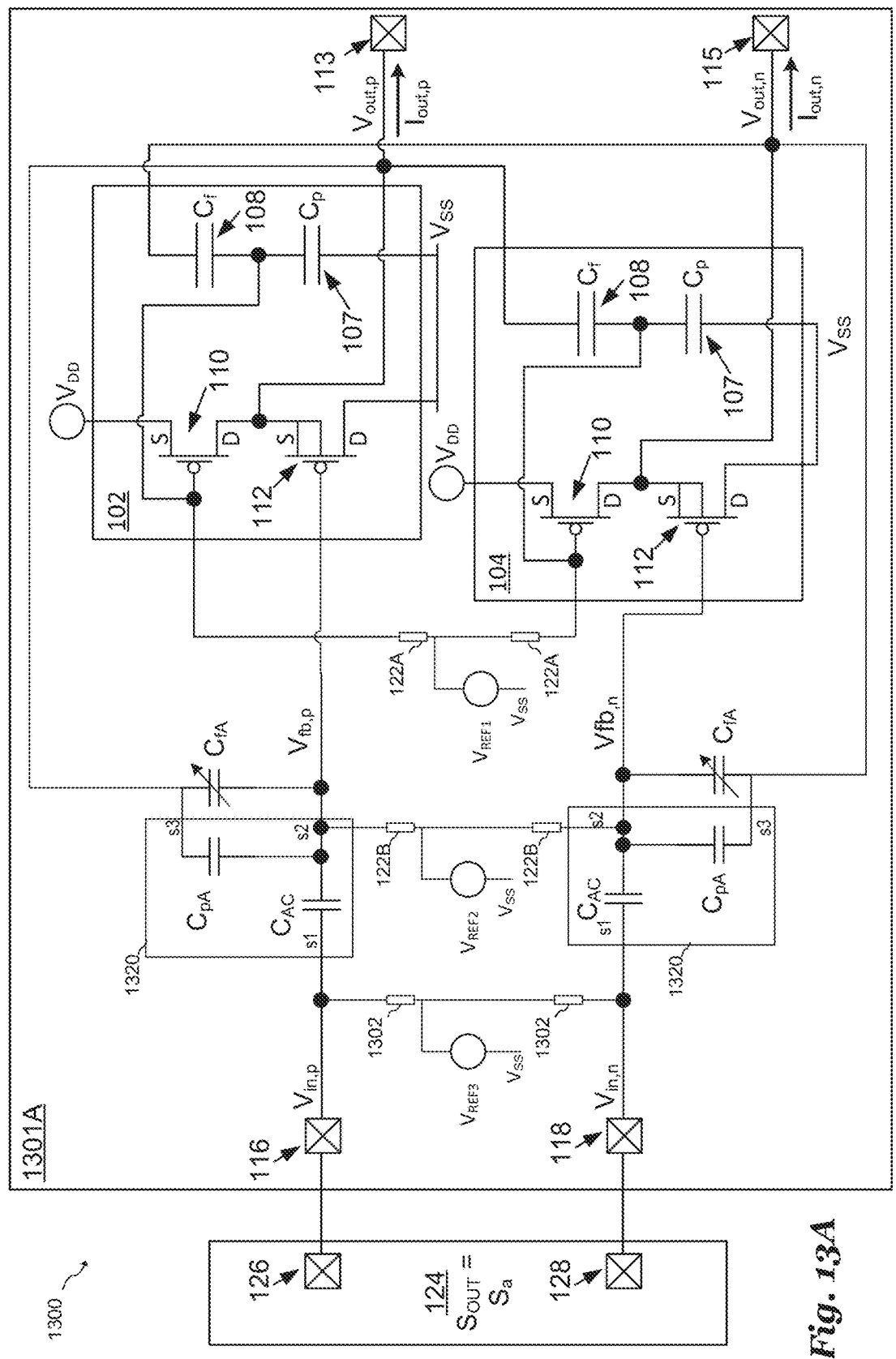
FIGS. 13A and 13B illustrate embodiment amplification systems that according to further embodiments.

FIG. 13A illustrates an embodiment amplification system 1300 that utilizes an AC coupling capacitor according to the above-described parasitic capacitance compensation scheme. As shown, amplification system 1300 includes input device 124 coupled to amplifier circuit 1301A. Amplifier circuit 1301A is similar to amplifier circuit 101A shown in FIG. 1A, with the addition of AC coupling capacitors $C_{AC}$ and adjustable feedback capacitors $C_{fA}$ (also referred to as a programmable capacitor). Parasitic capacitor $C_{pA}$ represents the parasitic capacitance of the structure of AC coupling capacitor $C_{AC}$. In the illustrated embodiment, the combination of AC coupling capacitor $C_{AC}$ and parasitic capacitor $C_{pA}$ is shown as a three-terminal device 1320 having a first signal terminal s1, a second signal terminal s2, and a first parasitic terminal s3.

As shown in FIG. 13A, one AC coupling capacitor $C_{AC}$ is coupled between input terminal 116 and the gate of source follower transistor 112 of input stage 102, while the other AC coupling capacitor $C_{AC}$ is coupled between input terminal 118 and the gate of source follower transistor 112 of input stage 104. Input stages 102 and 104 may be configured as non-inverting amplifiers in order to maintain a positive phase between the input and output of each input stage 102 and 104. These AC coupling capacitors $C_{AC}$ provide AC coupling between input device 124 and input stages 102 and 104, thereby allowing terminals 126 and 128 of input device 124 to be biased at a different DC voltage from gates of source follower transistors 112 of input stages 102 and 104. In some embodiments, all of the components in amplifier circuit 1301A are disposed on a single monolithic semiconductor substrate, while input device is external to the single monolithic semiconductor substrate. Alternatively, the various components depicted in FIG. 13A may be partitioned differently. While amplifier circuit 1301A is shown implementing a differential amplifier circuit, single-ended amplification systems can also be implemented using embodiment systems and methods.

It should be understood that any of the embodiments disclosed herein can be adapted to include the AC coupling capacitor $C_{AC}$ and adjustable feedback capacitor $C_{fA}$ in order to provide AC coupling to its respective amplifier circuits. For example, the input signal paths in the embodiments of FIGS. 1A, 1B, 1C, 2, 3, 4, 5A, 5B, 5C, 5D may be modified to include embodiment AC coupling circuits and systems. In addition, feedback capacitors $C_f$ in input stages 102 and 104 may utilize switchable capacitor networks as described above with respect to FIGS. 4 and 5A such that input stages 102 and 104 have a programmable gain and implement programmable gain amplifiers as described above.

Due to the addition of AC coupling capacitor $C_{AC}$, voltage source $V_{REF3}$ and high-ohmic resistance stages 1302 are used to provide a bias voltage to input terminals 116 and 118. Bias voltage source $V_{REF3}$, as well as voltage sources $V_{REF1}$ and $V_{REF2}$ may be implemented using bias generator circuits known in the art.

Figure 13B:
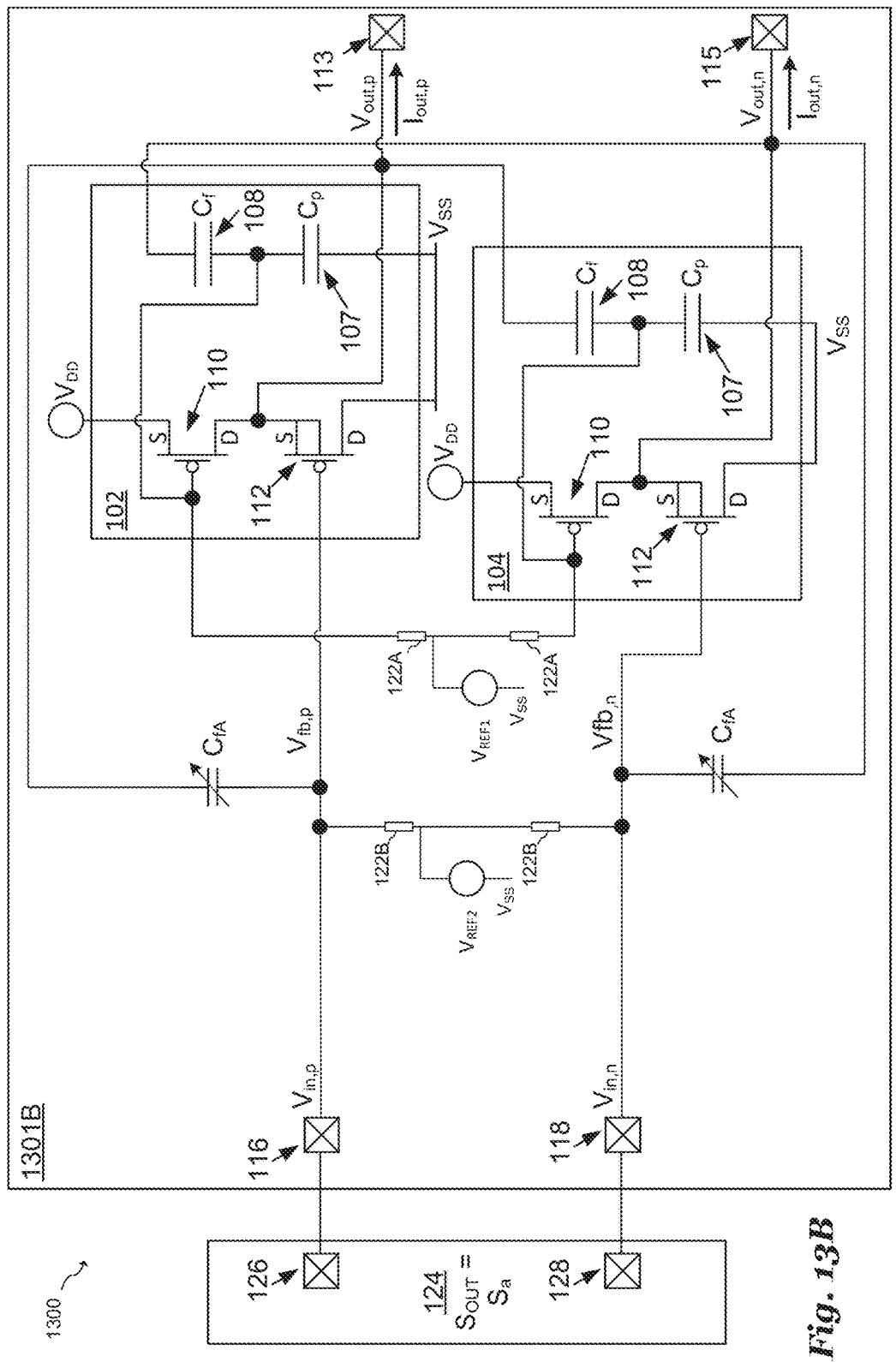

In some embodiments, the benefit of increased linearity afforded by adjustable feedback capacitor $C_{fA}$ may even be achieved without the inclusion of AC coupling capacitor $C_{AC}$, as shown in FIG. 13B that illustrates amplifier circuit 1301B. Amplifier circuit 1301B is similar to amplifier circuit 1301A shown in FIG. 13A with the exception that AC coupling capacitors $C_{AC}$, voltage source $V_{REF3}$ and high-ohmic resistance stages 1302 are omitted. The adjustable feedback capacitor $C_{fA}$ effectively increases the gain of input stages 102 and 104 without increasing the signal swing seen at the gate of current source biasing transistors 110 of input stages 102 and 104.

Figure 14A:
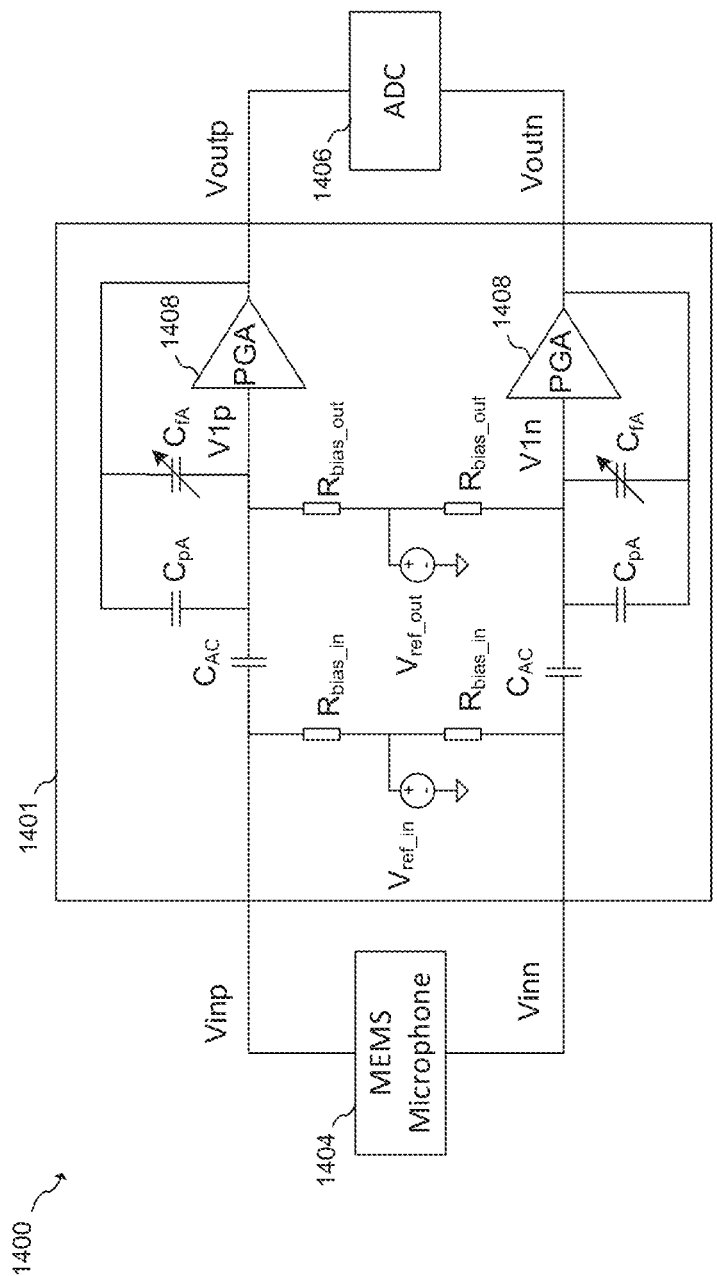
FIG. 14A illustrates an embodiment amplification system.

The operation of embodiment AC coupled systems will now be described with respect to FIGS. 14A-C. FIG. 14A illustrates an example embodiment amplification system 1400 that includes a MEMS microphone 1404, an AC coupled amplifier system 1401 configured to amplify the output of MEMS microphone 1404, and an analog-to-digital converter (ADC) 1406 configured to digitize the amplified MEMS microphone signal produced by AC coupled amplifier system 1401. AC coupled amplifier system 1401 may be representative of amplifier circuit 1301A described above with respect to FIG. 13A, or representative of any of the above-described amplifier circuit embodiments that have been adapted to provide AC coupling according to embodiment AC coupling systems and methods. In various embodiments, MEMS microphone 1404 is implemented using a double-back plate MEMS device 1404 that provides a differential signal to AC coupled amplifier system 1401 at input nodes Vinp and Vinn, and AC coupled amplifier systems 1401 provides a differential signal to ADC 1406 at output nodes Voutp and Voutn.

As shown, AC coupled amplifier system 1401 includes a programmable gain amplifiers (PGA) 1408 coupled between positive input node Vinp and positive output node Voutp, and between negative input node Vinn and negative output node Voutn. PGAs 1408 are representative of the embodiment amplifiers disclosed herein. AC coupling capacitors $C_{AC}$ provide AC coupling at the inputs of PGAs 1408. Input nodes Vinp and Vinn are biased by DC voltage source $V_{ref\_in}$ and high-ohmic resistors $R_{bias\_in}$, and the inputs of PGAs 1408 are biased by DC voltage source $V_{ref\_out}$ and high-ohmic resistors $R_{bias\_out}$. Capacitor $C_{pA}$ represents the parasitic capacitance of AC coupling capacitor $C_{AC}$ and capacitor $C_{fA}$ is feedback capacitance coupled between the output and input of each PGA 1408.

Figure 14B:
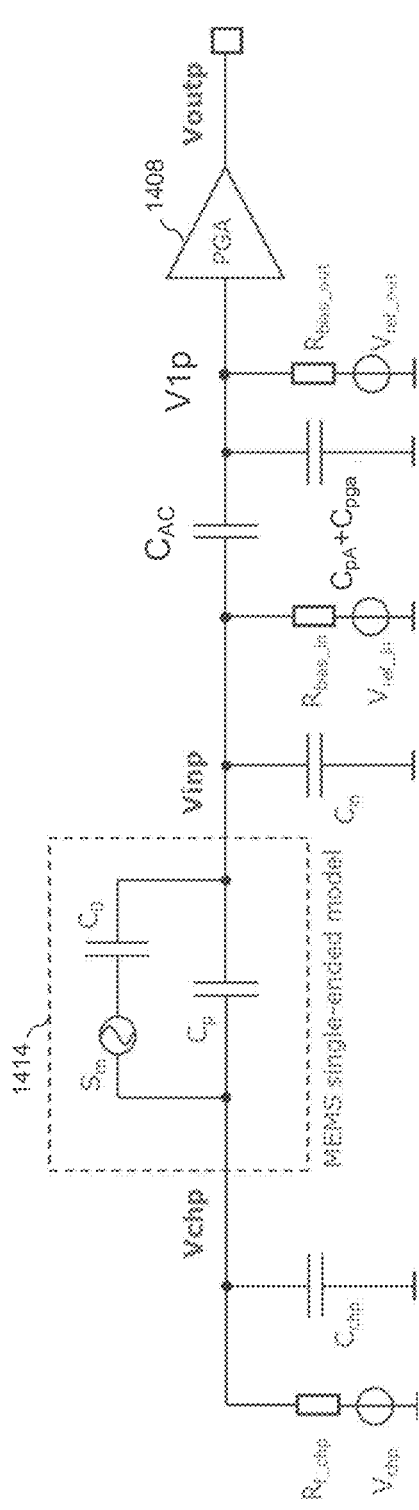
FIG. 14B illustrates a single-ended model of an embodiment amplification system having an AC coupled signal path, FIG. 14B illustrate a single-ended model of an amplification system having an AC coupled signal path.

FIG. 14B illustrates a single-ended model of the AC coupled amplification system 1401 and MEMS microphone 1404 of FIG. 14A that omits adjustable feedback capacitor $C_{fA}$ and the coupling of parasitic capacitor $C_{pA}$ to the output of PGA 1408. Thus, FIG. 14B represents an embodiment amplification system that is implemented without using embodiment parasitic capacitance compensation systems and methods. The MEMS microphone is represented by a single-ended MEMS microphone model 1414 that is modeled with three components: a main capacitance $C_o$ which is the capacitance between membrane and back-plate, a motor sensitivity $S_m$ and a parasitic capacitance $C_p$. Voltage source $V_{chp}$, resistor $R_{f\_chp}$ and capacitor $C_{chp}$ are used to model the output voltage and output impedance of a bias source, such as a charge pump, that is used to bias single-ended MEMS microphone model 1414. The input capacitance of PGA 1408 is modeled by capacitance $C_{pga}$. Thus, the capacitor labeled $C_{pA}+C_{pga}$ represents the sum of parasitic capacitor $C_{pA}$ of AC coupling capacitor $C_{AC}$ and the input capacitance $C_{pga}$ of PGA 1408. Capacitance $C_{in}$ models, for example, package and board capacitance coupled between the output of MEMS microphone 1404 and the input to AC coupled amplifier system 1401.

The system gain $A_{s\_std}$ from $S_m$ to the PGA output can be calculated according to:

$$A_{s\_std} = \frac{AC_0 C_{chp} C_{AC}}{\left[(C_0 + C_p + C_{chp})\left(\frac{C_{AC}(C_{pA} + C_{pga})}{(C_{AC} + C_{pA} + C_{pga})} + C_{in}\right) + (C_0 + C_p)C_{chp}\right]}{(C_{AC} + C_{pA} + C_{pga})},$$

where A is the voltage gain of PGA 1408. As can be seen by the equation above, besides the signal attenuation caused by parasitic capacitance $C_p$ of the MEMS microphone and input capacitance $C_{in}$, further attenuation is introduced by AC coupling capacitor $C_{AC}$ and its parasitic capacitance $C_{pA}$.

Figure 14C:
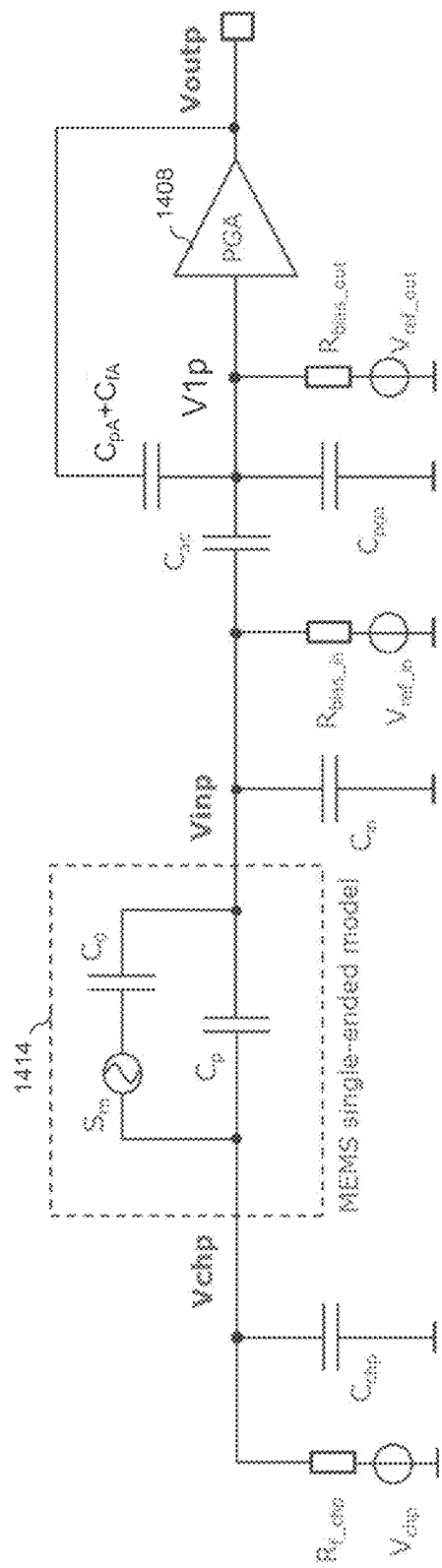
FIG. 14C illustrates a single-ended model of an amplification system having an AC coupled signal path with parasitic capacitance compensation.

FIG. 14C illustrates a single-ended model of the AC coupled amplification system 1401 and MEMS microphone 1404 of FIG. 14A that includes adjustable feedback capacitor $C_{fA}$ and the coupling of parasitic capacitor $C_{pA}$ to the output of PGA 1408. Thus, FIG. 14C represents an embodiment amplification system that is implemented using embodiment parasitic capacitance compensation methods.

The new system gain $A_{s\_new}$ can thus obtained from $A_{s\_std}$ replacing $C_{pA}$ by the expression $(C_{fA}+C_{pA})$ (1-A):

$$A_{s\_new} = \frac{AC_0 C_{chp} C_{AC}}{\left[(C_0 + C_p + C_{chp})\left(\frac{C_{AC}[C_{pga} + (C_{fA} + C_{pA})(1-A)]}{C_{AC} + C_{pga} + (C_{fA} + C_{pA})(1-A)} + C_{in}\right) + (C_0 + C_p)C_{chp}\right]}{[C_{AC} + C_{pga} + (C_{fA} + C_{pA})(1-A)]},$$

Therefore, system gain increases when $A > C_{fA}/(C_{fA}+C_{pA})$. In various embodiments improved linearity may be achieved by increasing the system gain in the manner described. In some embodiments, the system gain can be set by programming the value of adjustable feedback capacitor $C_{fA}$.

Figure 15A:
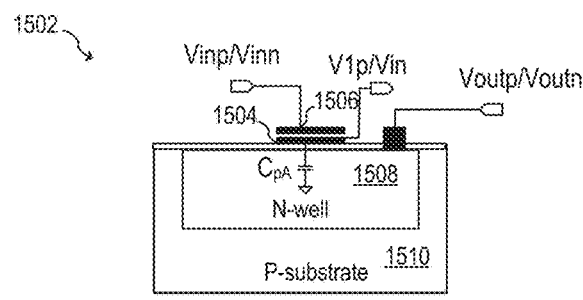
FIGS. 15A and 15B illustrate cross-sections of embodiment AC coupling capacitor structures.
Figure 15B:
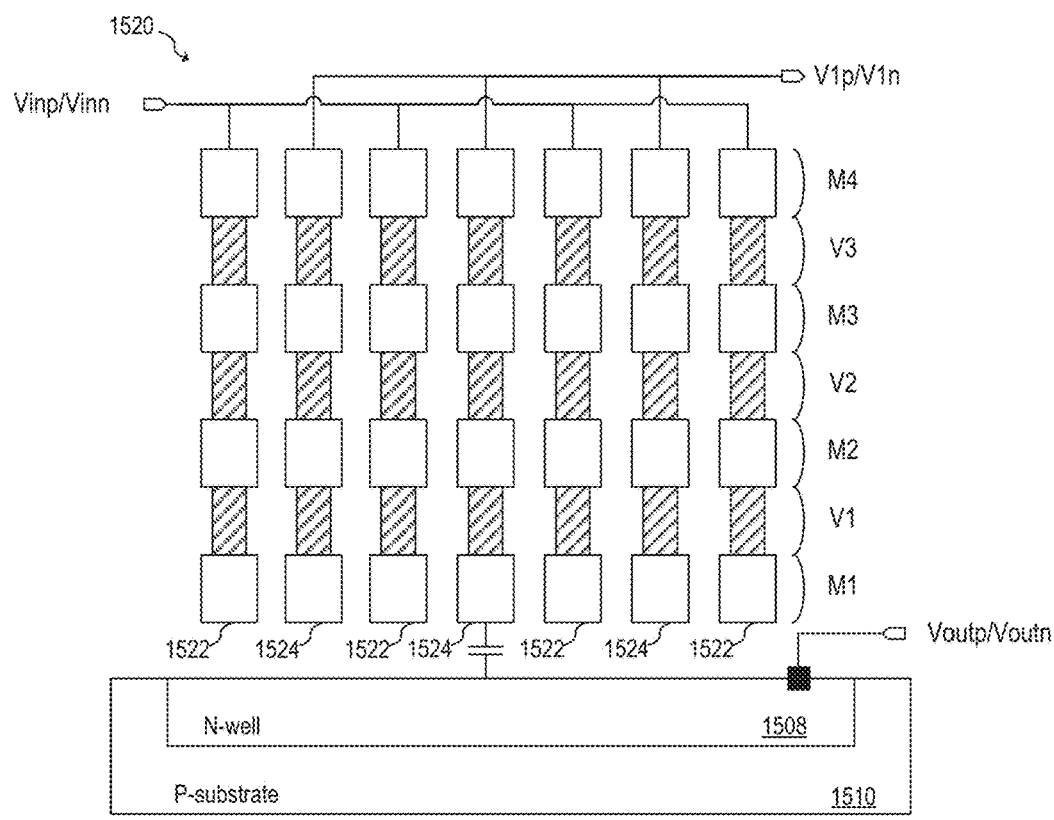

FIGS. 15A and 15B illustrate cross-sectional views of capacitor structures that may be used to implement embodiment AC coupling capacitors. FIG. 15A illustrates a cross-sectional view of a capacitor 1502 that is formed by a top plate 1506 configured to be coupled to one of input voltage nodes Vinp or Vinn, and bottom plate 1504 configured to be coupled to the input of one of PGAs 1408. Alternatively, top plate 1506 may be coupled to the input of one of PGAs 1408, and bottom plate 1504 may be coupled to one of input voltage node Vinp or Vinn. Both top plate 1506 and bottom plate 1504 are disposed over n-well 1508, which is disposed in p-substrate 1510. Parasitic capacitance $C_{pA}$ is formed by the capacitance between bottom plate 1504 and n-well 1508. One of output nodes Voutp or Voutn are coupled to n-well 1508 via an ohmic contact.

In some embodiments, bottom plate 1504 and top plate 1506 are implemented in metallization layers to form a metal-insulator-metal (MIM) capacitor. Alternatively, other conductive layers, such as polysilicon layers, can be used to form bottom plate 1504 and/or top plate 1506.

FIG. 15B illustrates a cross-sectional view of a capacitor 1520 that include vertically arranged conductive plates 1522 and 1524 of various metal and via layers. As shown, conductive plates 1522 are configured to be coupled to one of input voltage nodes Vinp or Vinn, and conductive plates 1524 are configured to be coupled to be coupled to the input of one of PGAs 1408. Each plate of plates 1522 and 1524 include a stack of metal and vias. In the illustrated embodiment, each plate 1522 and 1524 comprises a stack that include a first metallization layer M1, a first via layer V1, a second metallization layer M2, a second via layer V2, a third metallization layer M3, a third via layer V3, and a fourth metallization layer M4. As shown, plates 1522 and 1524 are disposed over a semiconductor n-well 1508, which is disposed in p-substrate 1510. Parasitic capacitance $C_{pA}$ is formed by the capacitance between plates 1524 and n-well 1508. It should be understood that the specific structure of capacitor 1520 shown in FIG. 15B is just one example of many possible vertically arranged capacitor structures that can be used to implement embodiment AC coupling capacitors. For example, in alternative embodiments, greater or fewer plates and/or greater or fewer metallization and via layers than those illustrated in FIG. 15B can be used to implement capacitor 1520.

While the embodiments of FIGS. 15A and 15B show the AC coupling capacitor disposed over n-well 1508 disposed in p-substrate 1510, embodiment AC coupling capacitors may be disposed over other types of semiconductor regions besides n-well 1508 and p-substrate 1510. For example, in alternative embodiments the semiconductor regions disposed underneath embodiment AC coupling capacitors may include, for example, a p-well in an n-substrate or an n-epi layer.

It should also be understood that the capacitor structures illustrated in FIGS. 15A and 15B are just two examples of possible capacitor structures that can be uses to implement embodiment AC coupling capacitors. In alternative embodiments, other structures can be used.

Figure 16:
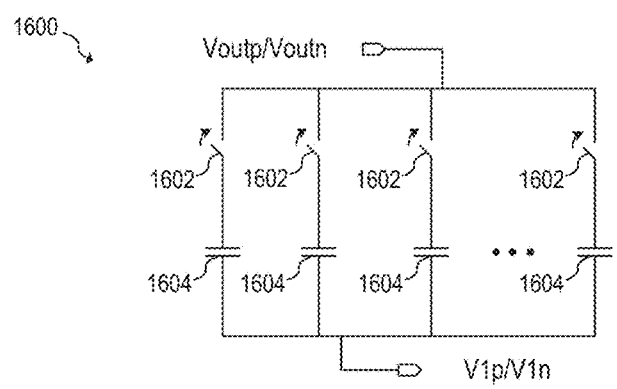
FIG. 16 illustrates a schematic of an embodiment programmable capacitance circuit.

FIG. 16 illustrates a programmable capacitance circuit 1600 that can be used to implement adjustable feedback capacitor $C_{fA}$ shown in FIGS. 13 and 14A. As shown, programmable capacitance circuit 1600 includes a plurality of switchable capacitor segments coupled in parallel. Each switchable capacitor segment includes a capacitor 1604 coupled in series with a switch 1602. Accordingly, the capacitance of programmable capacitance 1600 can be adjusted by selectively activating switches 1602. Capacitors 1604 may be implemented using on-chip capacitor structures known in the art, and switches 1602 may be implemented, for example, using transistor switches such as NMOS or PMOS transistors. In alternative embodiments of the present invention, other adjustable capacitor circuits known in the art may be used to implement adjustable feedback capacitor $C_{fA}$. For example, a voltage controlled capacitor implemented using a reverse biased pn-junction may be used.

It should be understood that the technical discussion above with respect to FIGS. 14A-14C and 16, although directed to embodiments having an AC coupling capacitor, may also be applied to embodiments in which the AC coupling capacitor has been omitted, such as the embodiment of FIG. 13B.

Example embodiments of the present invention are summarized here. Other embodiments can also be understood from the entirety of the specification and the claims filed herein.

Example 1

A system including: a first AC coupling capacitor including a first signal terminal, a second signal terminal, and a first parasitic terminal, where the first AC coupling capacitor has a first capacitance between the first signal terminal and the second signal terminal and a second capacitance between the second signal terminal and the first parasitic terminal; a first amplifier having an input coupled to the first signal terminal of the first AC coupling capacitor; and a first programmable capacitor coupled between an output of the first amplifier and the second signal terminal of the first AC coupling capacitor.

Example 2

The system of example 1, where the first AC coupling capacitor includes a first conductive plate coupled to the first signal terminal, a second conductive plate coupled to the second signal terminal and a semiconductor region coupled to the first parasitic terminal, the semiconductor region disposed adjacent to the first conductive plate and the second conductive plate.

Example 3

The system of example 2 or example 2, where the first conductive plate and the second conductive plate are implemented in metallization layers of a semiconductor circuit and the semiconductor region includes an n-well disposed beneath the first conductive plate and the second conductive plate.

Example 4

The system of one of examples 1-3, further including a microphone coupled to the first signal terminal of the first AC coupling capacitor.

Example 5

The system of one of examples 1-4, further including an analog-to-digital converter coupled to the output of the first amplifier.

Example 6

The system of one of examples 1-5, further including: a second AC coupling capacitor including a third signal terminal, a fourth signal terminal, and a second parasitic terminal, where the second AC coupling capacitor has the first capacitance between the third signal terminal and the fourth signal terminal and the second capacitance between the fourth signal terminal and the second parasitic terminal; a second amplifier having an input coupled to the third signal terminal of the second AC coupling capacitor; and a second programmable capacitor coupled between an output of the second amplifier and the fourth signal terminal of the second AC coupling capacitor.

Example 7

The system of example 6, further including: a first capacitor network coupled between the output of the first amplifier and a bias node of the second amplifier; and a second capacitor network coupled between the output of the second amplifier and a bias node of the first amplifier.

Example 8

The system of example 7, where the first capacitor network includes a first plurality of switchable capacitors, the second capacitor network includes a second plurality of switchable capacitors, the first programmable capacitor includes a third plurality of switchable capacitors, and the second programmable capacitor includes a fourth plurality of switchable capacitors.

Example 9

The system of example 6 or 7, further including a double-back plate Micro-Electro-Mechanical Systems (MEMS) microphone having a first back plate coupled to the first signal terminal, and a second back plate coupled to the third signal terminal.

Example 10

The system of one of examples 1-9, where the first programmable capacitor includes a plurality of switchable capacitor segments coupled in parallel, where each of the switchable capacitor segments includes a capacitor coupled in series with a switch.

Example 11

A differential amplifier circuit including: a first buffer circuit including a first source follower transistor having a gate coupled to a first input of the differential amplifier circuit and a source coupled to a first output of the differential amplifier circuit, and a first current source transistor having a drain coupled to a source of the first source follower transistor; a second buffer circuit including a second source follower transistor having a gate coupled to a second input of the differential amplifier circuit and a source coupled to a second output of the differential amplifier circuit, and a second current source transistor having a drain coupled to a source of the second source follower transistor; a first capacitor network coupled between the first output of the differential amplifier circuit and a gate of the second current source transistor; a first feedback capacitor coupled between the first output of the differential amplifier circuit and the first input of the differential amplifier circuit; a second capacitor network coupled between the second output of the differential amplifier circuit and a gate of the first current source transistor; and a second feedback capacitor coupled between the second output of the differential amplifier circuit and the second input of the differential amplifier circuit.

Example 12

The differential amplifier circuit of example 11, further including: a first AC coupling capacitor having a first terminal coupled to the first input of the differential amplifier circuit, a second terminal coupled to the gate of the first source follower transistor, and a parasitic terminal coupled to the first output of the differential amplifier circuit; and a second AC coupling capacitor having a first terminal coupled to the first second of the differential amplifier circuit, a second terminal coupled to the gate of the second source follower transistor, and a parasitic terminal coupled to the second output of the differential amplifier circuit.

Example 13

The differential amplifier circuit of example 12, further including: a first bias generator coupled to the first terminal of the first AC coupling capacitor and the first terminal of the second AC coupling capacitor; and a second bias generator coupled to the second terminal of the first AC coupling capacitor and the second terminal of the second AC coupling capacitor.

Example 14

The differential amplifier circuit of one of examples 11-13, where the first capacitor network, the second capacitor network, the first feedback capacitor and the second feedback capacitor each include a respective programmable capacitor.

Example 15

The differential amplifier circuit of one of examples 11-14, where the differential amplifier circuit is disposed on a single monolithic semiconductor substrate.

Example 16

A method of amplifying an output of Micro-Electro-Mechanical Systems (MEMS) microphone, the method including: AC coupling a first output of the MEMS microphone using a first AC coupling capacitor to produce a first AC coupled signal at a first feedback node; amplifying the first AC coupled signal using a first amplifier to produce a first amplified signal; and feeding back the first amplified signal to the first feedback node via a first programmable capacitor.

Example 17

The method of example 16, further including feeding back the first amplified signal to the first feedback node via a parasitic capacitance of the first AC coupling capacitor coupled in parallel with the first programmable capacitor.

Example 18

The method of example 17, further including: AC coupling a second output of the MEMS microphone using a second AC coupling capacitor to produce a second AC coupled signal at a second feedback node; amplifying the second AC coupled signal using a second amplifier to produce a second amplified signal; and feeding back the second amplified signal to the second feedback node via a parasitic capacitance of the second AC coupling capacitor coupled in parallel with a second programmable capacitor.

Example 19

The method of example 18, where the MEMS microphone includes a double-back plate MEMS microphone.

Example 20

The method of one of example 18 or 19, further including: capacitively coupling the first amplified signal to a bias node of the second amplifier; and capacitively coupling the second amplified signal to a bias node of the first amplifier.

Example 21

The method of example 20, where: the first amplifier is a first source follower amplifier and capacitively coupling the second amplified signal to the bias node of the first amplifier modulates a first current through the first source follower amplifier; and the second amplifier is a second source follower amplifier and capacitively coupling the first amplified signal to the bias node of the second amplifier modulates a second current through the second source follower amplifier.

Example 22

The method of example 21, where: the first source follower amplifier is a first Super Source Follower (SSF) stage; and the second source follower amplifier is a second SSF stage.

Example 23

An integrated circuit including: a first non-inverting amplifier disposed on a monolithic semiconductor substrate, the first non-inverting amplifier having an input coupled to a first input pad of the monolithic semiconductor substrate; and a first programmable capacitor disposed on the monolithic semiconductor substrate, the first programmable capacitor directly connected between an output of the first non-inverting and the input of the first non-inverting amplifier.

Example 24

The integrated circuit of example 23, further including: a second non-inverting amplifier disposed on a monolithic semiconductor substrate, the second non-inverting amplifier having an input coupled to a second input pad of the monolithic semiconductor substrate; and a second programmable capacitor disposed on the monolithic semiconductor substrate, the second programmable capacitor directly connected between an output of the second non-inverting and the input of the second non-inverting amplifier.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
a first AC coupling capacitor comprising a first signal terminal, a second signal terminal, and a first parasitic terminal, wherein the first AC coupling capacitor has a first capacitance between the first signal terminal and the second signal terminal and a second capacitance between the second signal terminal and the first parasitic terminal, wherein the second capacitance is a parasitic capacitance of the first AC coupling capacitor;
a first amplifier having an input coupled to the first signal terminal of the first AC coupling capacitor and an output coupled to the first parasitic terminal of the first AC coupling capacitor; and
a first programmable capacitor coupled between the output of the first amplifier and the second signal terminal of the first AC coupling capacitor.

2. The system of claim 1, wherein the first AC coupling capacitor comprises a first conductive plate coupled to the first signal terminal, a second conductive plate coupled to the second signal terminal and a semiconductor region coupled to the first parasitic terminal, the semiconductor region disposed adjacent to the first conductive plate and the second conductive plate.

3. The system of claim 2, wherein the first conductive plate and the second conductive plate are implemented in metallization layers of a semiconductor circuit and the semiconductor region comprises an n-well disposed beneath the first conductive plate and the second conductive plate.

4. The system of claim 1, further comprising a microphone coupled to the first signal terminal of the first AC coupling capacitor.

5. The system of claim 1, further comprising an analog-to-digital converter coupled to the output of the first amplifier.

6. The system of claim 1, further comprising:
a second AC coupling capacitor comprising a third signal terminal, a fourth signal terminal, and a second parasitic terminal, wherein the second AC coupling capacitor has a first main capacitance between the third signal terminal and the fourth signal terminal and a second parasitic capacitance between the fourth signal terminal and the second parasitic terminal, wherein the second parasitic capacitance is a parasitic capacitance of the second AC coupling capacitor;
a second amplifier having an input coupled to the third signal terminal of the second AC coupling capacitor and an output coupled to the second parasitic terminal of the second AC coupling capacitor; and
a second programmable capacitor coupled between the output of the second amplifier and the fourth signal terminal of the second AC coupling capacitor.

7. The system of claim 6, further comprising:
a first capacitor network coupled between the output of the first amplifier and a bias node of the second amplifier; and
a second capacitor network coupled between the output of the second amplifier and a bias node of the first amplifier.

8. The system of claim 7, wherein the first capacitor network comprises a first plurality of switchable capacitors, the second capacitor network comprises a second plurality of switchable capacitors, the first programmable capacitor comprises a third plurality of switchable capacitors, and the second programmable capacitor comprises a fourth plurality of switchable capacitors.

9. The system of claim 6, comprising a double-back plate Micro-Electro-Mechanical Systems (MEMS) microphone having a first back plate coupled to the first signal terminal, and a second back plate coupled to the third signal terminal.

10. The system of claim 1, wherein the first programmable capacitor comprises a plurality of switchable capacitor segments coupled in parallel, wherein each of the switchable capacitor segments comprises a capacitor coupled in series with a switch.

11. A differential amplifier circuit comprising:
a first buffer circuit comprising a first source follower transistor having a gate coupled to a first input of the differential amplifier circuit and a source coupled to a first output of the differential amplifier circuit, and a first current source transistor having a drain coupled to a source of the first source follower transistor;
a second buffer circuit comprising a second source follower transistor having a gate coupled to a second input of the differential amplifier circuit and a source coupled to a second output of the differential amplifier circuit, and a second current source transistor having a drain coupled to the source of the second source follower transistor;
a first capacitor network coupled between the first output of the differential amplifier circuit and a gate of the second current source transistor;
a first feedback capacitor coupled between the first output of the differential amplifier circuit and the first input of the differential amplifier circuit;
a second capacitor network coupled between the second output of the differential amplifier circuit and a gate of the first current source transistor; and
a second feedback capacitor coupled between the second output of the differential amplifier circuit and the second input of the differential amplifier circuit.

12. The differential amplifier circuit of claim 11, further comprising:
a first AC coupling capacitor having a first terminal coupled to the first input of the differential amplifier circuit, a second terminal coupled to the gate of the first source follower transistor, and a parasitic terminal coupled to the first output of the differential amplifier circuit; and
a second AC coupling capacitor having a first terminal coupled to the first second of the differential amplifier circuit, a second terminal coupled to the gate of the second source follower transistor, and a parasitic terminal coupled to the second output of the differential amplifier circuit.

13. The differential amplifier circuit of claim 12, further comprising:
a first bias generator coupled to the first terminal of the first AC coupling capacitor and the first terminal of the second AC coupling capacitor; and
a second bias generator coupled to the second terminal of the first AC coupling capacitor and the second terminal of the second AC coupling capacitor.

14. The differential amplifier circuit of claim 11, wherein the first capacitor network, the second capacitor network, the first feedback capacitor and the second feedback capacitor each comprise a respective programmable capacitor.

15. The differential amplifier circuit of claim 11, wherein the differential amplifier circuit is disposed on a single monolithic semiconductor substrate.

16. A method of amplifying an output of Micro-Electro-Mechanical Systems (MEMS) microphone, the method comprising:
AC coupling a first output of the MEMS microphone using a first AC coupling capacitor to produce a first AC coupled signal at a first feedback node;
amplifying the first AC coupled signal using a first amplifier to produce a first amplified signal;
feeding back the first amplified signal to the first feedback node via a first programmable capacitor; and
feeding back the first amplified signal to the first feedback node via a parasitic capacitance of the first AC coupling capacitor coupled in parallel with the first programmable capacitor.

17. The method of claim 16, further comprising:
AC coupling a second output of the MEMS microphone using a second AC coupling capacitor to produce a second AC coupled signal at a second feedback node;
amplifying the second AC coupled signal using a second amplifier to produce a second amplified signal; and
feeding back the second amplified signal to the second feedback node via a parasitic capacitance of the second AC coupling capacitor coupled in parallel with a second programmable capacitor.

18. The method of claim 17, wherein the MEMS microphone comprises a double-back plate MEMS microphone.

19. The method of claim 17, further comprising:
capacitively coupling the first amplified signal to a bias node of the second amplifier; and
capacitively coupling the second amplified signal to a bias node of the first amplifier.

20. The method of claim 19, wherein:
the first amplifier is a first source follower amplifier and capacitively coupling the second amplified signal to the bias node of the first amplifier modulates a first current through the first source follower amplifier; and
the second amplifier is a second source follower amplifier and capacitively coupling the first amplified signal to the bias node of the second amplifier modulates a second current through the second source follower amplifier.

21. The method of claim 20, wherein:
the first source follower amplifier is a first Super Source Follower (SSF) stage; and
the second source follower amplifier is a second SSF stage.

22. An integrated circuit comprising:
a first non-inverting amplifier disposed on a monolithic semiconductor substrate, the first non-inverting amplifier having an input coupled to a first input pad of the monolithic semiconductor substrate;
a first programmable capacitor disposed on the monolithic semiconductor substrate, the first programmable capacitor directly connected between an output of the first non-inverting amplifier and the input of the first non-inverting amplifier; and
a first AC coupling capacitor coupled between first input pad and the input of the first non-inverting amplifier, wherein a first parasitic capacitance of the first AC coupling capacitor is coupled between the output of the first non-inverting amplifier and the input of the first non-inverting amplifier.

23. The integrated circuit of claim 22, further comprising:
a second non-inverting amplifier disposed on the monolithic semiconductor substrate, the second non-inverting amplifier having an input coupled to a second input pad of the monolithic semiconductor substrate; and a second programmable capacitor disposed on the monolithic semiconductor substrate, the second programmable capacitor directly connected between an output of the second non-inverting amplifier and the input of the second non-inverting amplifier.

24. The integrated circuit of claim 23, further comprising:
a second AC coupling capacitor coupled between second input pad and the input of the second non-inverting amplifier, wherein a second parasitic capacitance of the second AC coupling capacitor is coupled between the output of the second non-inverting amplifier and the input of the second non-inverting amplifier.

* * * * *